(12) United States Patent
Choi

(10) Patent No.: US 10,720,756 B2
(45) Date of Patent: Jul. 21, 2020

(54) VERTICAL CAVITY SURFACE EMITTING LASER AND METHOD FOR MANUFACTURING SAME

(71) Applicant: RAYIR, CO., Gyeonggi-do (KR)

(72) Inventor: Won Jin Choi, Gyeonggi-do (KR)

(73) Assignee: RAYIR, CO., Gyeonggi-do (KR)

( * ) Notice: Subject to any disclaimer, the term of this patent is extended or adjusted under 35 U.S.C. 154(b) by 0 days.

(21) Appl. No.: 16/323,544

(22) PCT Filed: Apr. 3, 2018

(86) PCT No.: PCT/KR2018/003942
§ 371 (c)(1),
(2) Date: Feb. 6, 2019

(87) PCT Pub. No.: WO2018/186668
PCT Pub. Date: Oct. 11, 2018

(65) Prior Publication Data
US 2019/0181615 A1 Jun. 13, 2019

(30) Foreign Application Priority Data

Apr. 4, 2017 (KR) .................. 10-2017-0043746
Sep. 11, 2017 (KR) .................. 10-2017-0115800
(Continued)

(51) Int. Cl.
*H01S 5/183* (2006.01)
*H01S 5/42* (2006.01)
(Continued)

(52) U.S. Cl.
CPC ...... *H01S 5/18397* (2013.01); *H01S 5/18311* (2013.01); *H01S 5/18361* (2013.01);
(Continued)

(58) Field of Classification Search
CPC .. H01S 5/183; H01S 5/18397; H01S 5/18311; H01S 5/18361; H01S 5/18333;
(Continued)

(56) References Cited

U.S. PATENT DOCUMENTS

| 5,013,684 A | * | 5/1991 | Epler | .................. H01L 21/182 |
| | | | | 117/89 |
| 6,185,241 B1 | * | 2/2001 | Sun | .................. H01S 5/18369 |
| | | | | 372/46.01 |

(Continued)

FOREIGN PATENT DOCUMENTS

| JP | H05-175615 A | 7/1993 |
| JP | 2010-080571 A | 4/2010 |
| JP | 2012-114185 A | 6/2012 |
| KR | 10-2006-0128332 A | 12/2006 |
| KR | 10-2008-0024910 A | 3/2008 |

OTHER PUBLICATIONS

Grabherr, Martin et al. "Fabrication and performance of tuneable single-mode VCSELs emitting in the 750- to 1000-nm range" Proceedings of SPIE, Proc. of SPIE vol. 5737 (10 pages).

(Continued)

*Primary Examiner* — Armando Rodriguez
(74) *Attorney, Agent, or Firm* — Osha Liang LLP

(57) ABSTRACT

An embodiment discloses a vertical cavity surface emitting laser and a method for manufacturing the same, the vertical cavity surface emitting laser comprising: a substrate; a lower reflective layer disposed on the substrate; an active layer disposed on the lower reflective layer; an oxide layer disposed on the active layer and comprising a first hole disposed at the center thereof; a capping layer disposed on the oxide layer; and an upper reflective layer disposed on the capping layer and the first hole.

18 Claims, 24 Drawing Sheets

(30) Foreign Application Priority Data

| Dec. 8, 2017 | (KR) | 10-2017-0168095 |
|---|---|---|
| Jan. 16, 2018 | (KR) | 10-2018-0005632 |
| Jan. 17, 2018 | (KR) | 10-2018-0006109 |

(51) Int. Cl.
*H01S 5/04* (2006.01)
*H01S 5/20* (2006.01)

(52) U.S. Cl.
CPC .............. *H01S 5/426* (2013.01); *H01S 5/041* (2013.01); *H01S 5/18333* (2013.01); *H01S 5/18394* (2013.01); *H01S 5/2068* (2013.01); *H01S 5/423* (2013.01); *H01S 2301/173* (2013.01); *H01S 2301/176* (2013.01); *H01S 2304/00* (2013.01)

(58) Field of Classification Search
CPC ...... H01S 5/18394; H01S 5/426; H01S 5/041; H01S 5/2068; H01S 5/423; H01S 2301/176

See application file for complete search history.

(56) References Cited

U.S. PATENT DOCUMENTS

| 7,359,421 | B2* | 4/2008 | Brenner | B82Y 20/00 |
|---|---|---|---|---|
| | | | | 372/50.124 |
| 9,742,153 | B1 | 8/2017 | Barve et al. | |
| 10,199,794 | B1 | 2/2019 | Yuen | |
| 10,205,303 | B1 | 2/2019 | Hegblom | |
| 10,250,012 | B2 | 4/2019 | Barve et al. | |
| 10,355,456 | B2 | 7/2019 | Yuen et al. | |
| 2008/0020553 | A1 | 1/2008 | Ryou et al. | |
| 2015/0380901 | A1* | 12/2015 | Brenner | H01S 5/34326 |
| | | | | 372/45.012 |

OTHER PUBLICATIONS

International Search Report issued in corresponding International Application No. PCT/KR2018/003942 dated Jul. 20, 2018 (2 pages).
Written Opinion issued in corresponding International Application No. PCT/KR2018/003942 dated Jul. 20, 2018 (5 pages).
Office Action issued in corresponding Chinese Application No. 201810709035.0 dated Aug. 9, 2019 (9 pages).

\* cited by examiner

[FIG. 1]
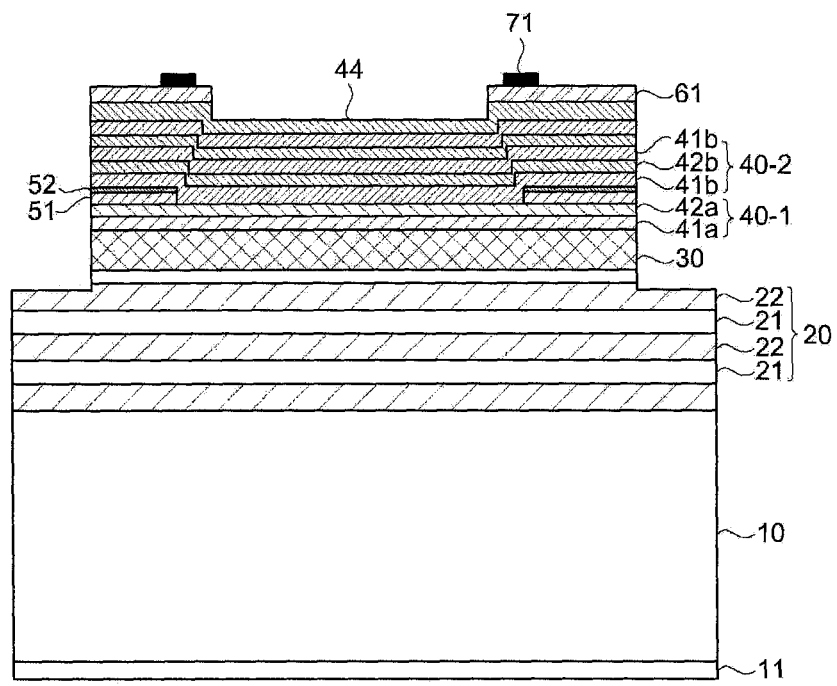

【FIG. 2】
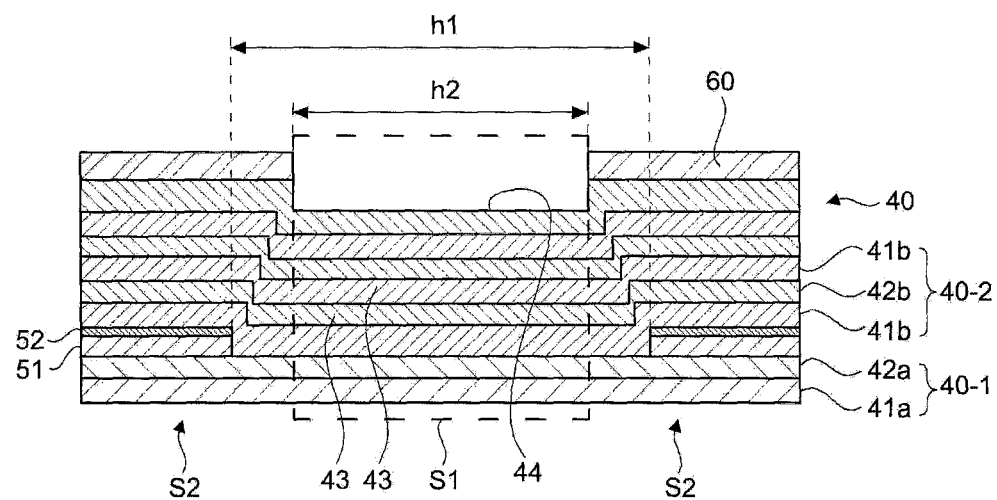
【FIG. 3】
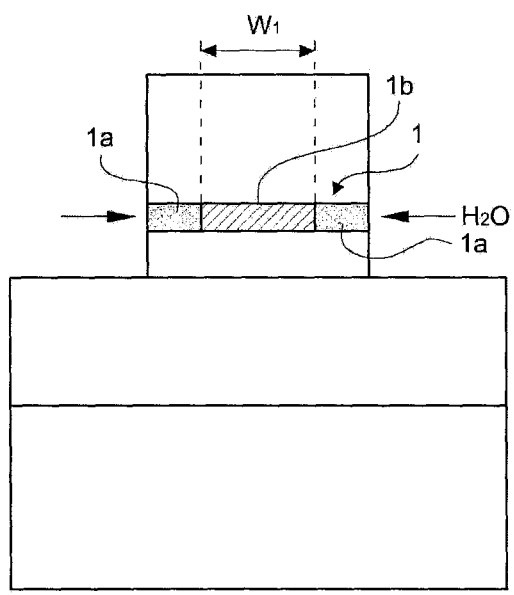

【FIG. 4】
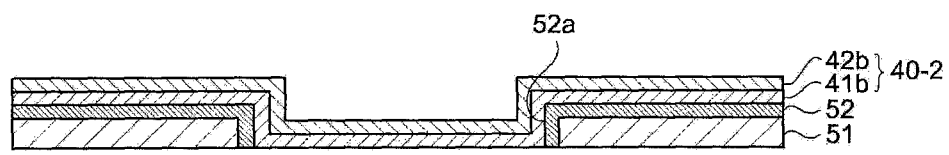
【FIG. 5】
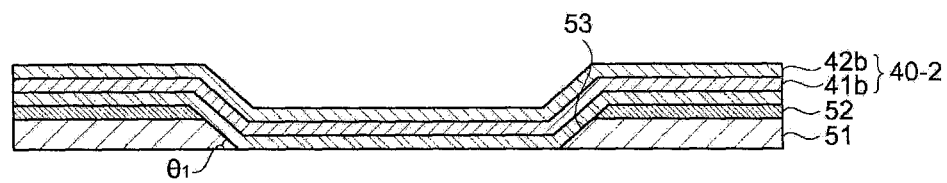
【FIG. 6】
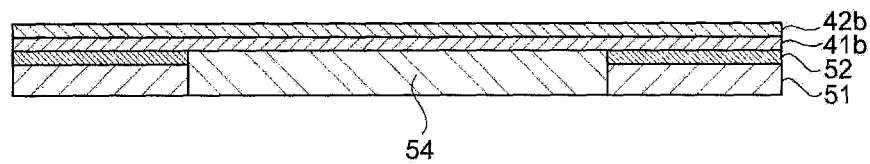

[FIG. 7]
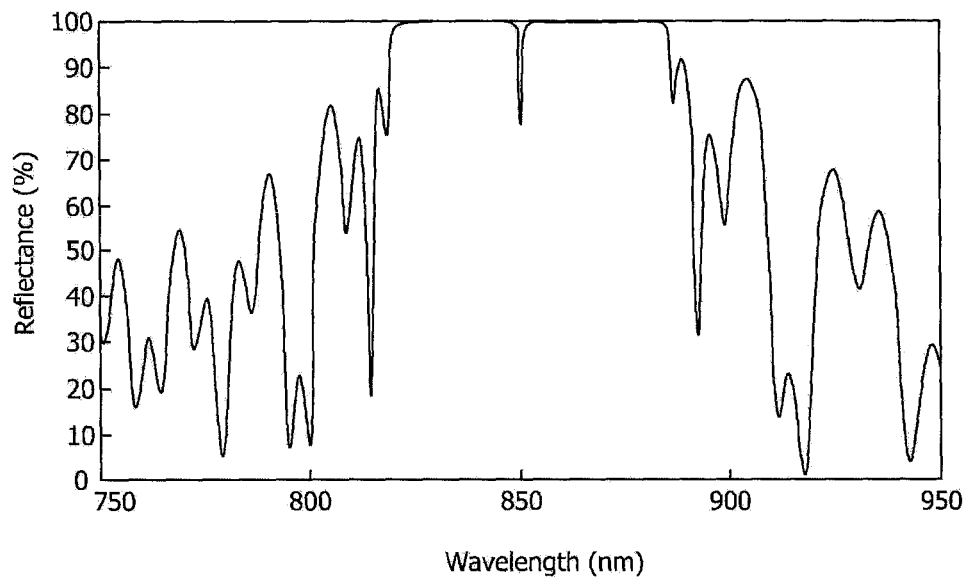
[FIG. 8]
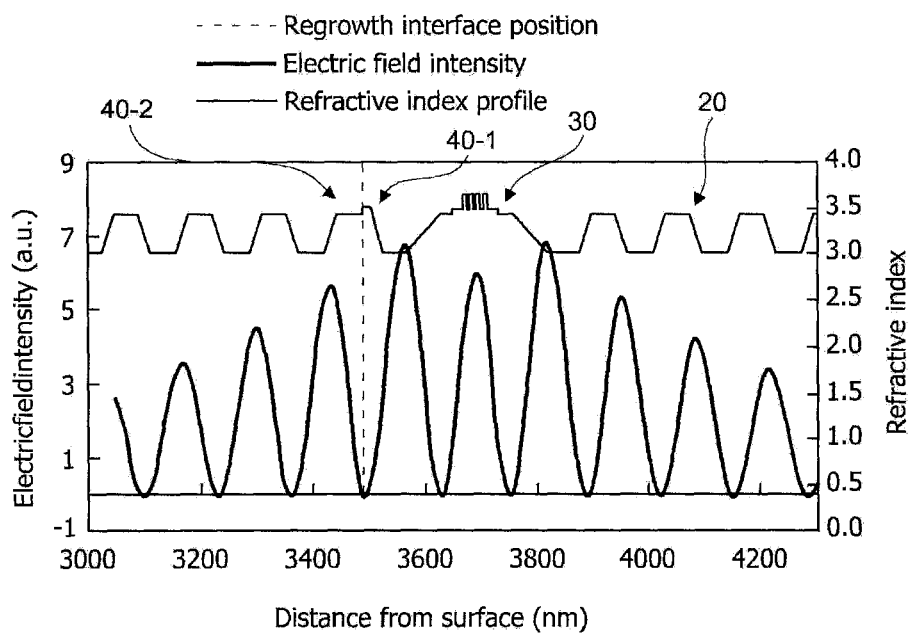

[FIG. 9]
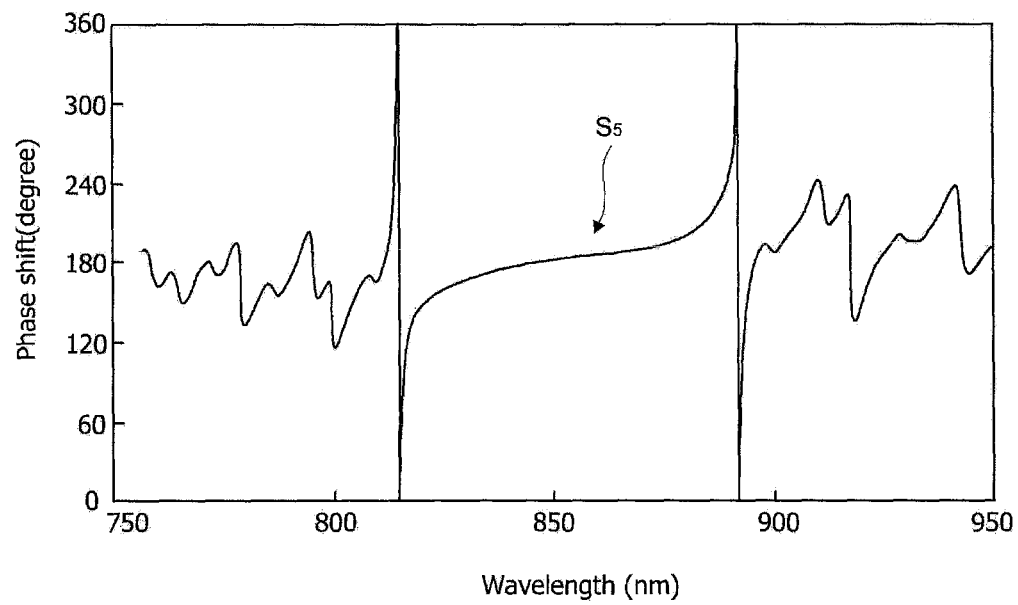
[FIG. 10a]
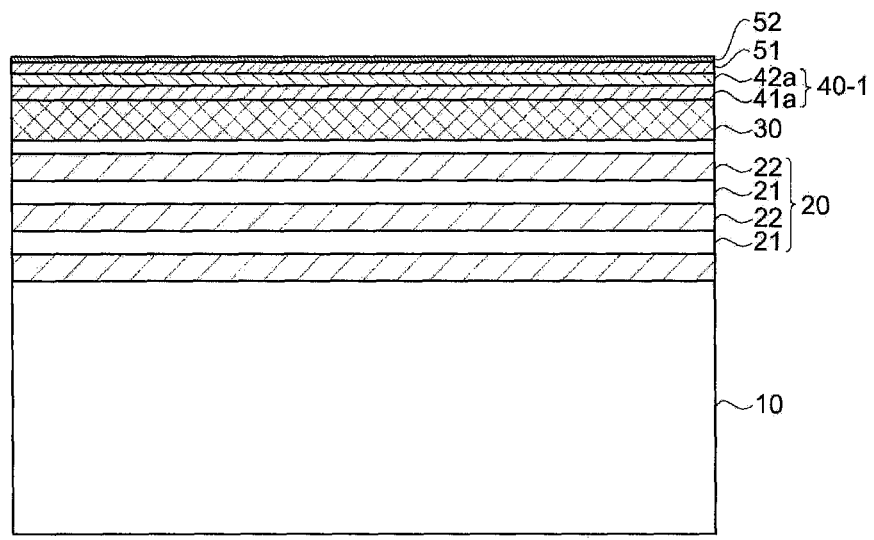

[FIG. 10b]
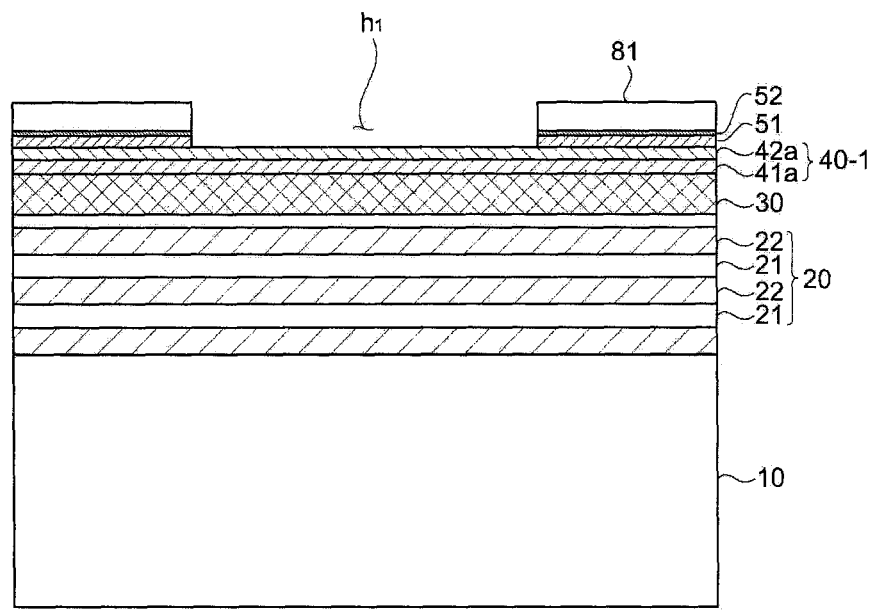
[FIG. 10c]
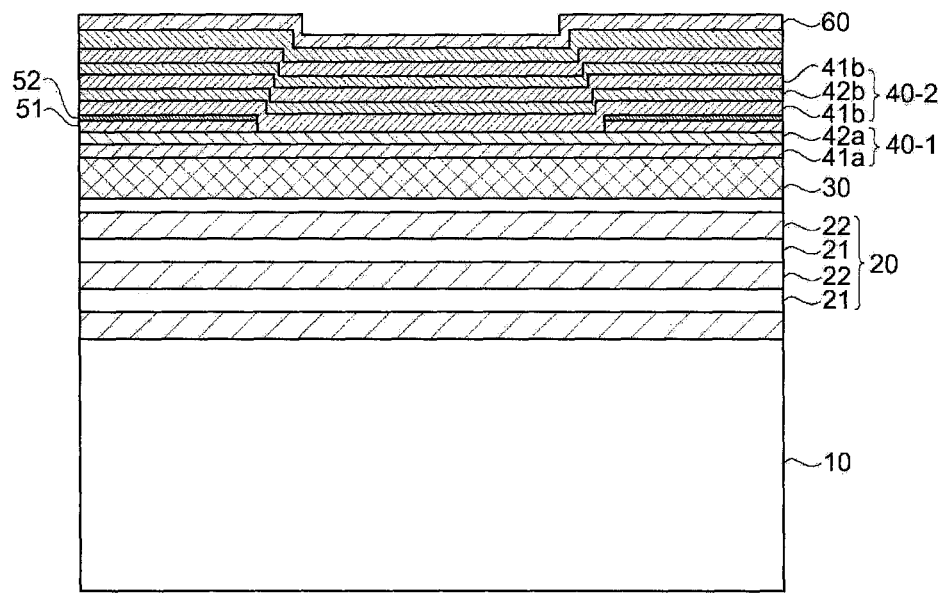

[FIG. 10d]
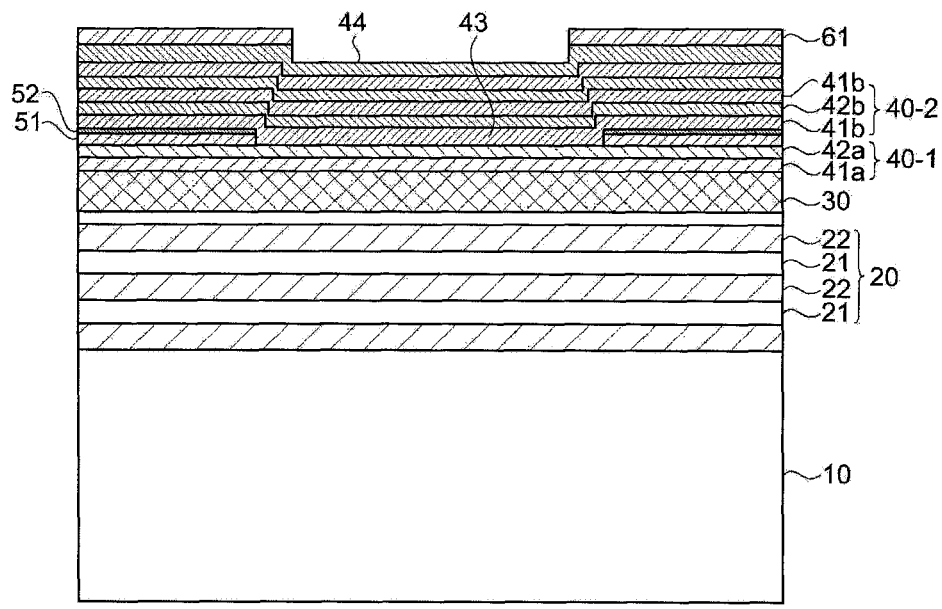
[FIG. 10e]
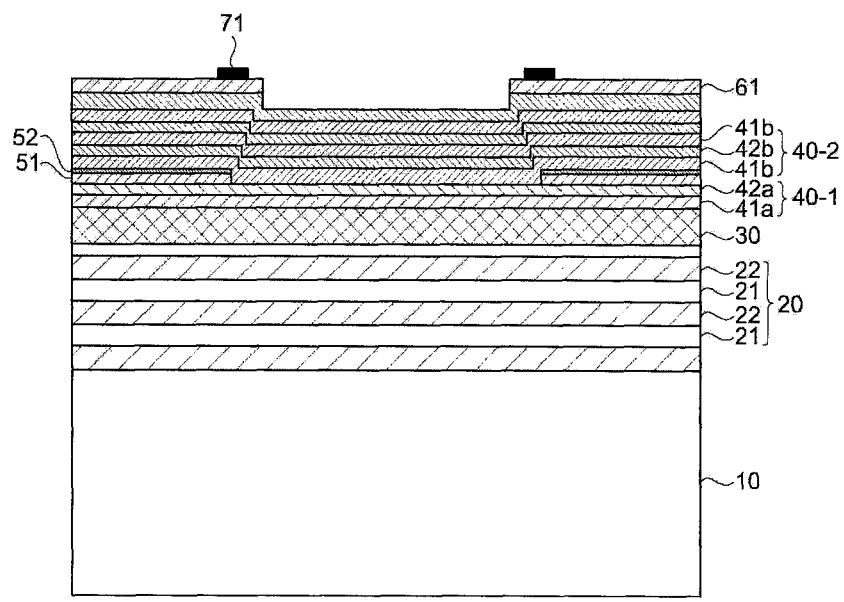

[FIG. 10f]
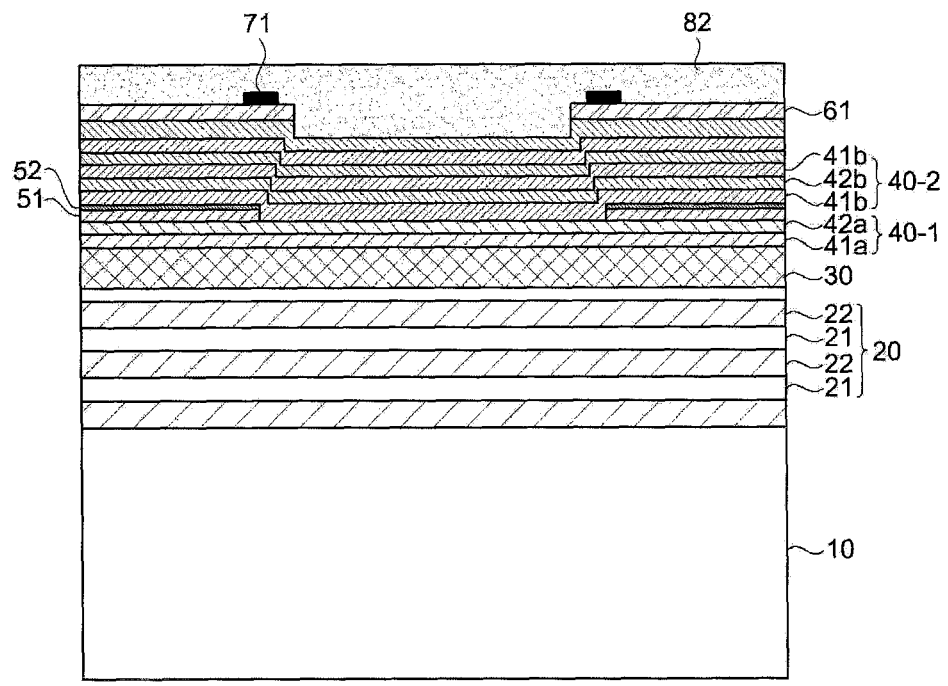
[FIG. 10g]
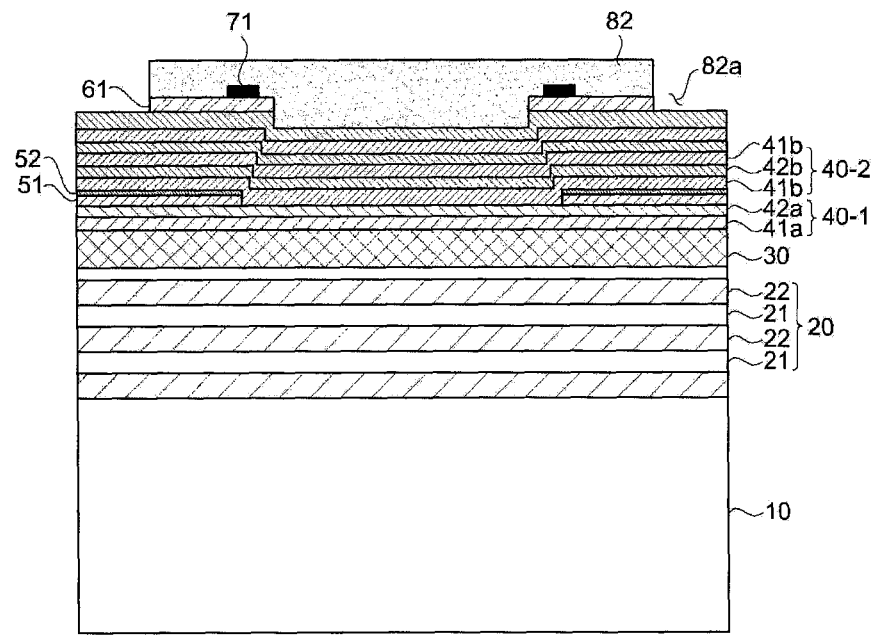

[FIG. 10h]
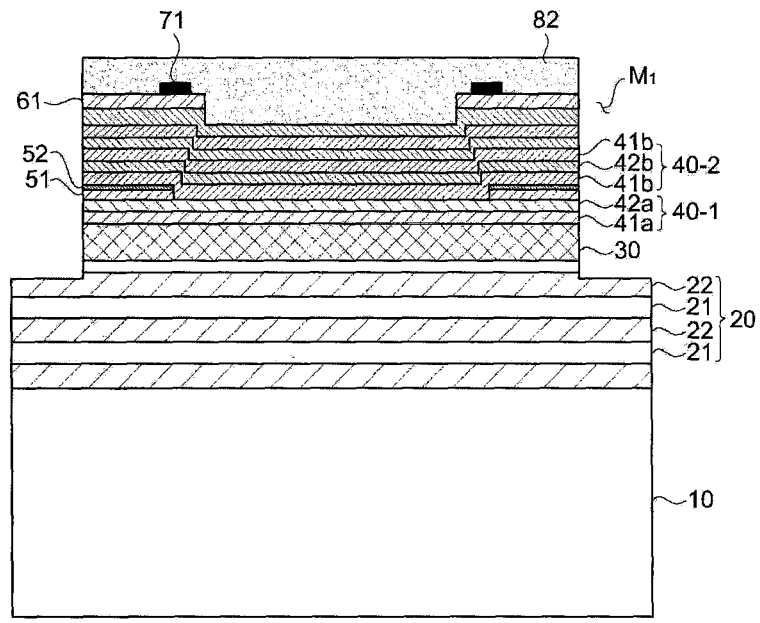
[FIG. 10i]
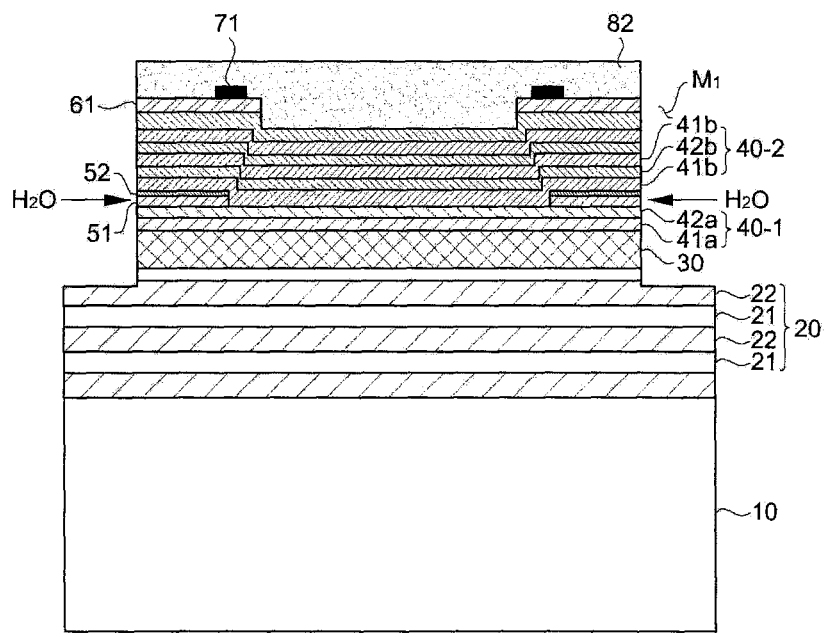

【FIG. 10j】
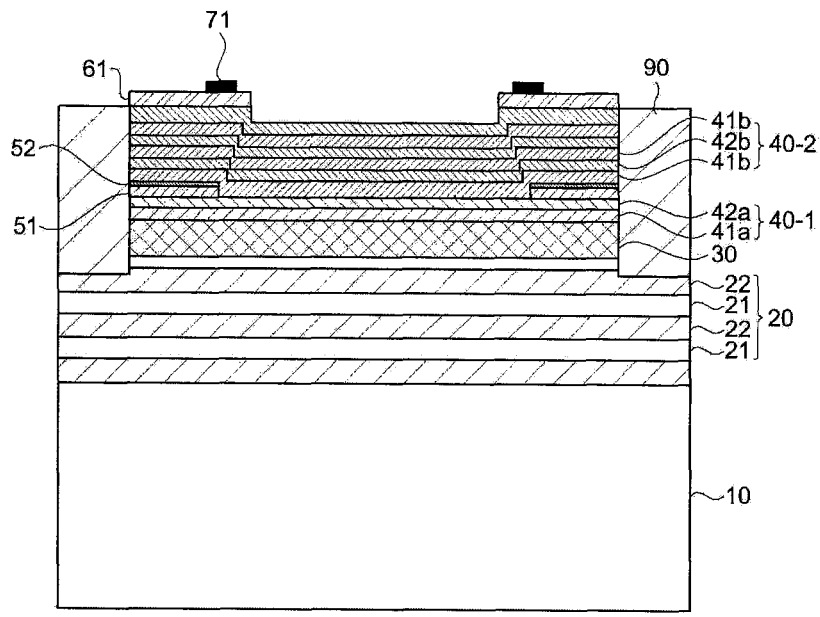
【FIG. 10k】
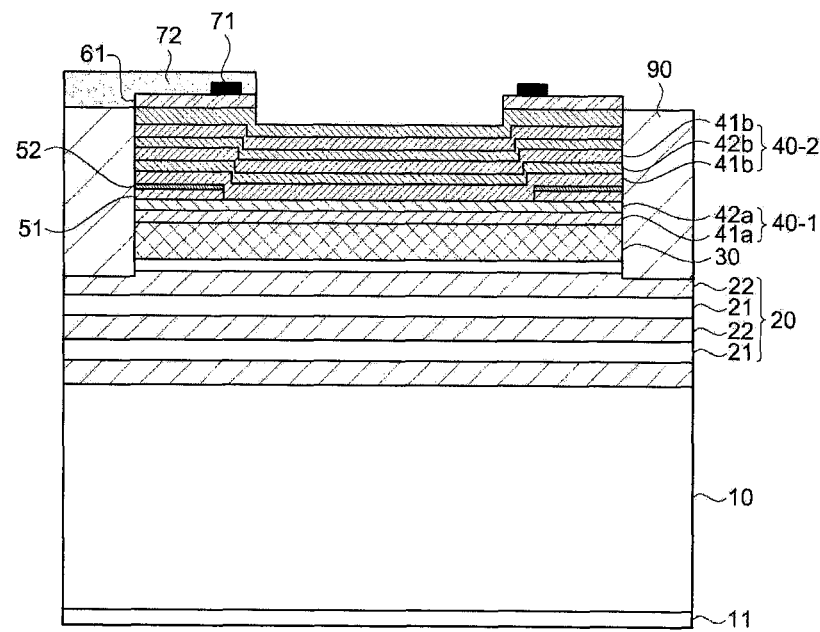

[FIG. 11a]
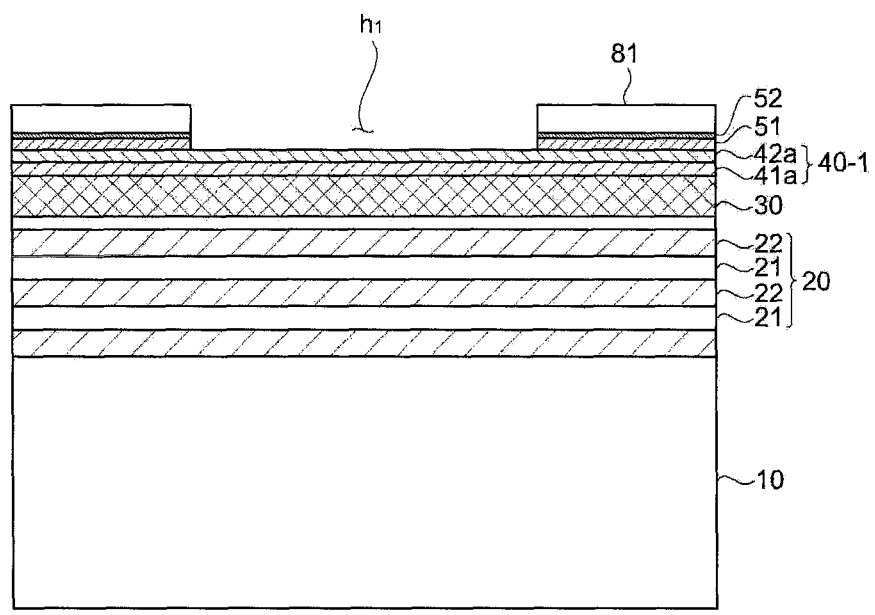
[FIG. 11b]
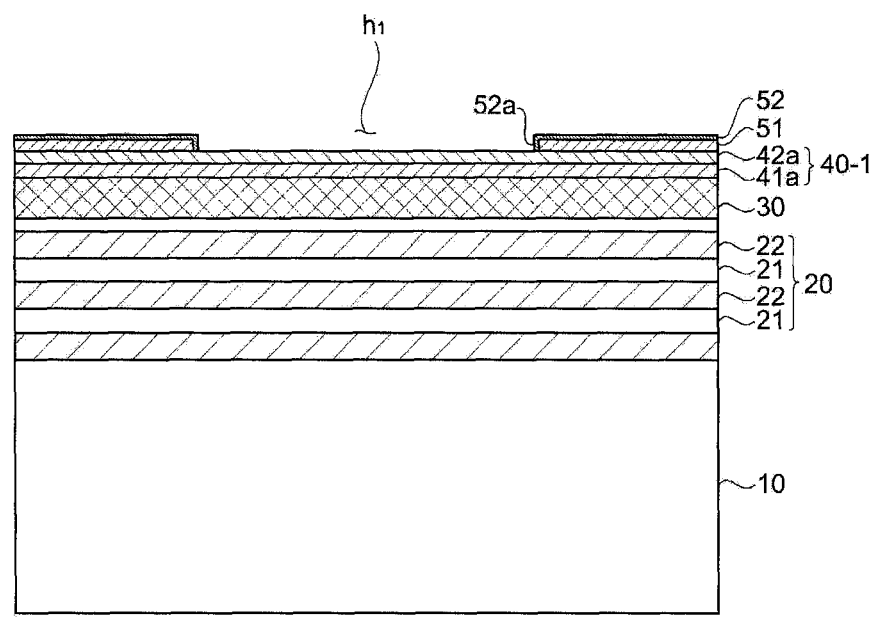

[FIG. 11c]
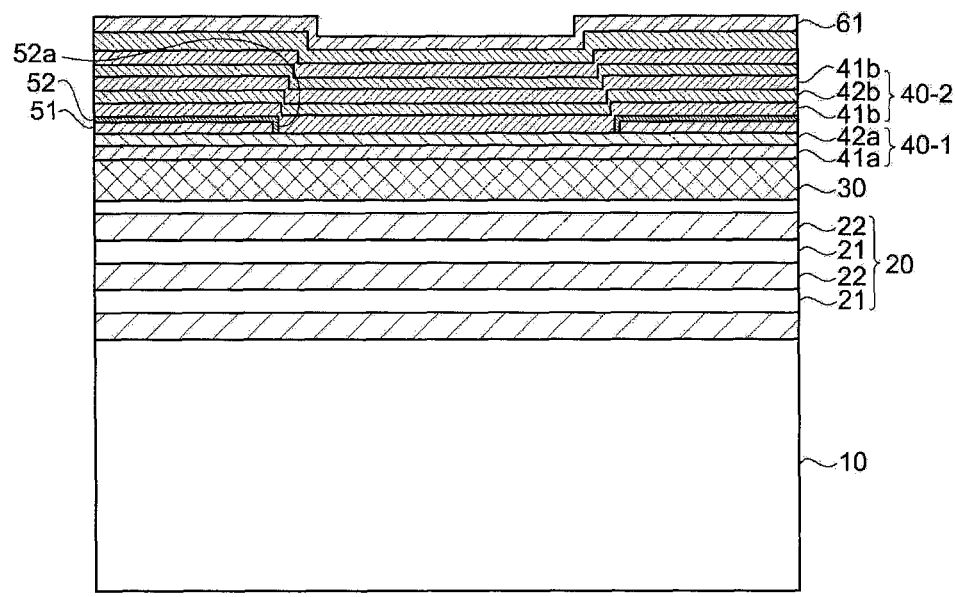
[FIG. 12]
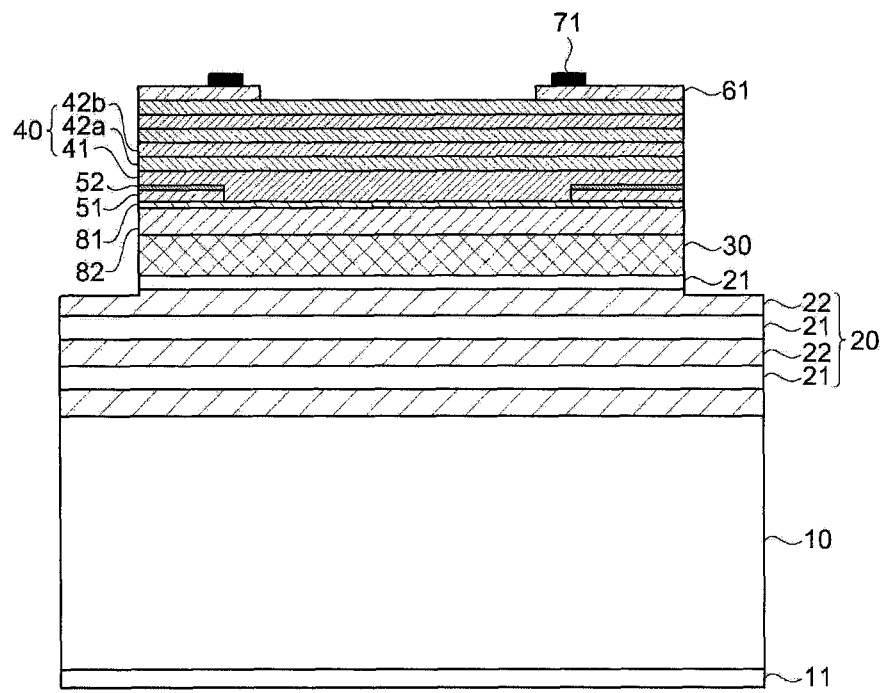

【FIG. 13】
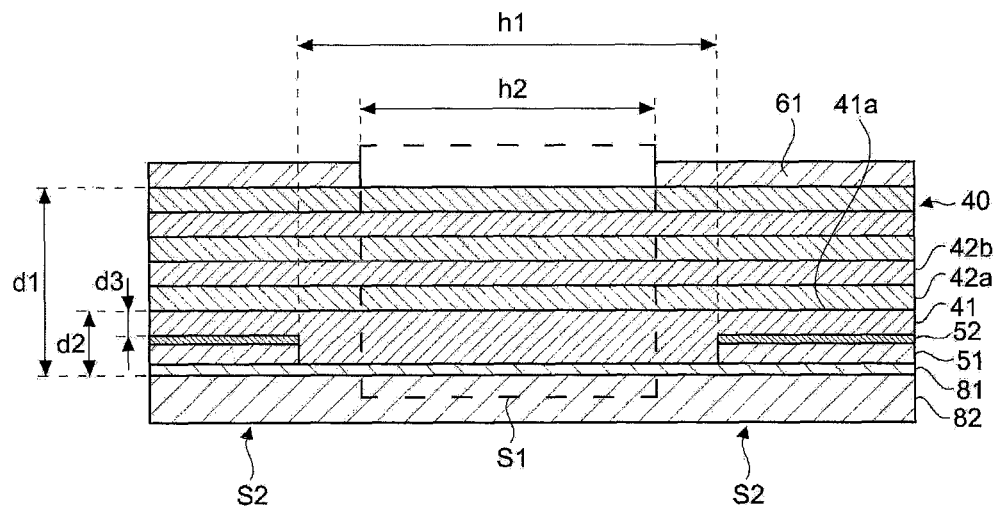
【FIG. 14】
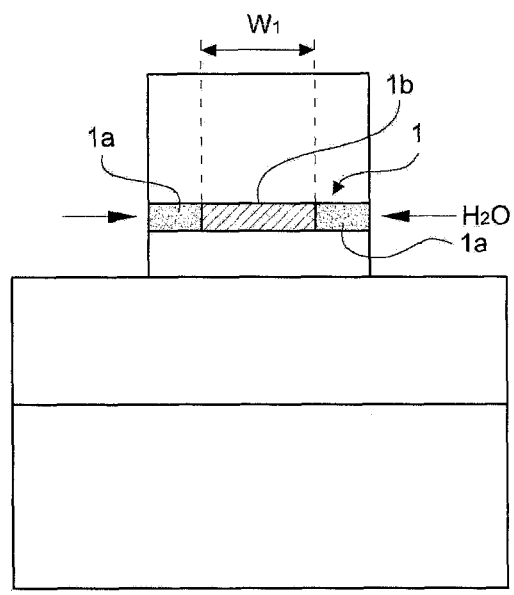

[FIG. 15]
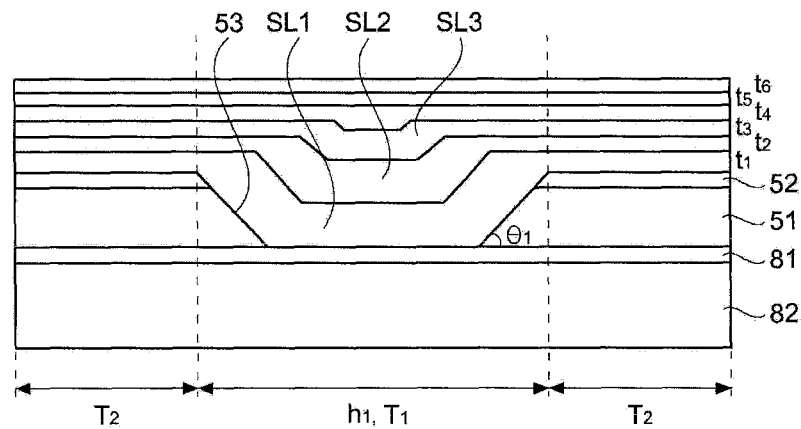
[FIG. 16]
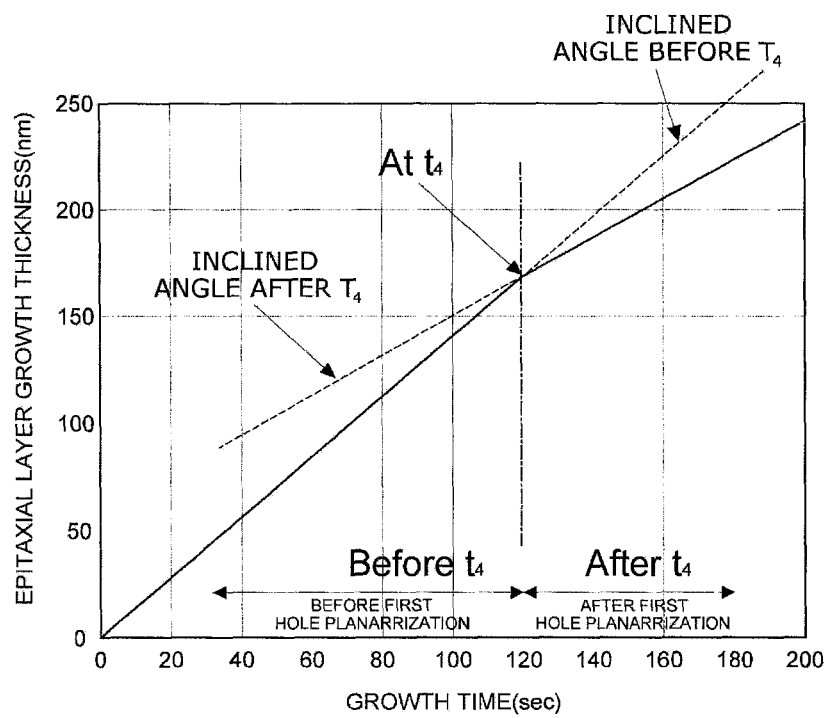

【FIG. 17】
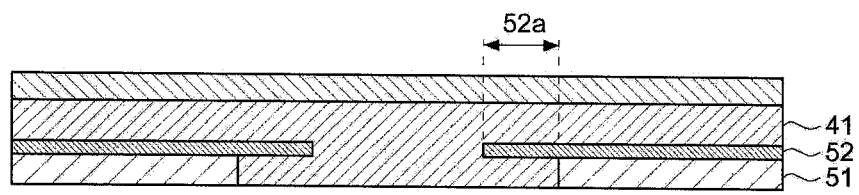
【FIG. 18】
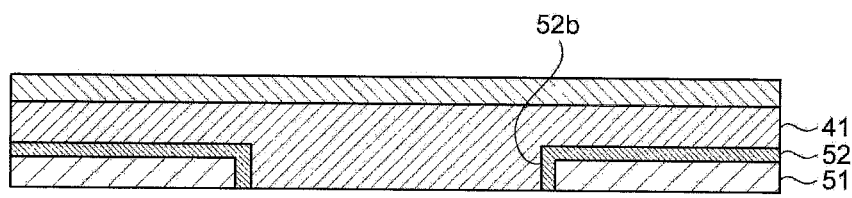
【FIG. 19】
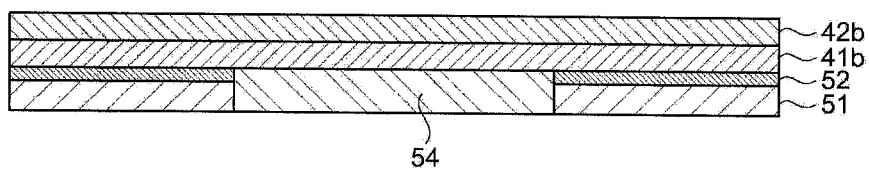

[FIG. 20]
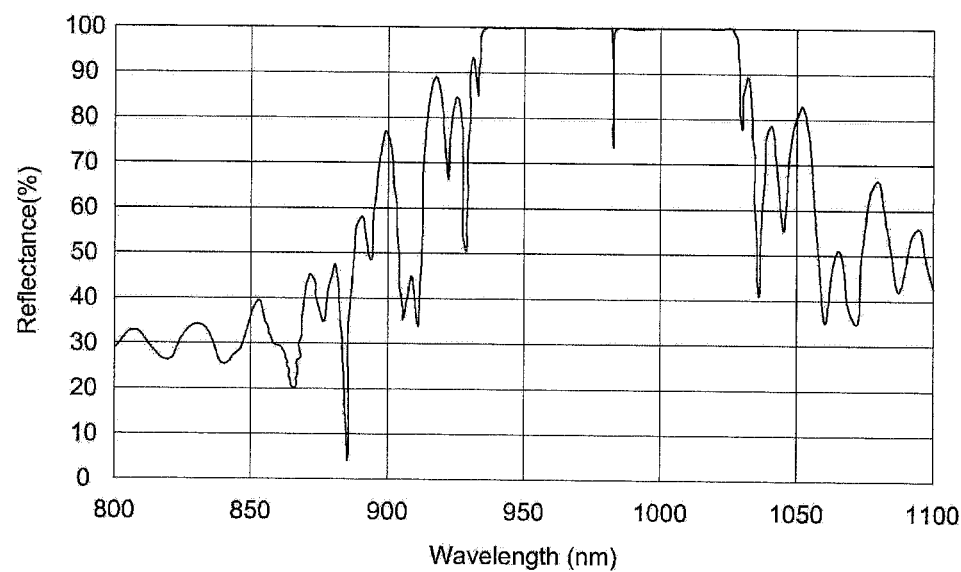
[FIG. 21]
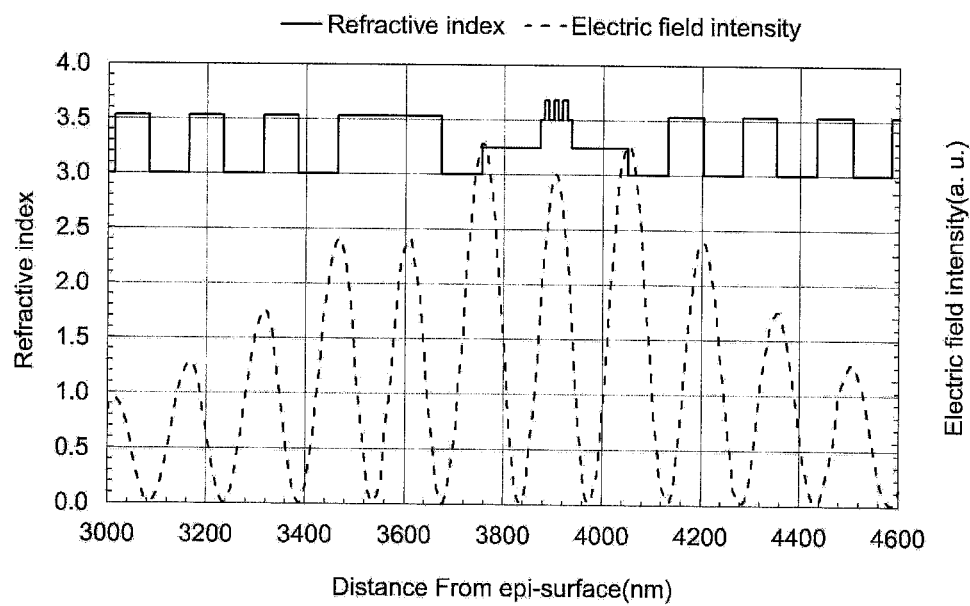

[FIG. 22a]
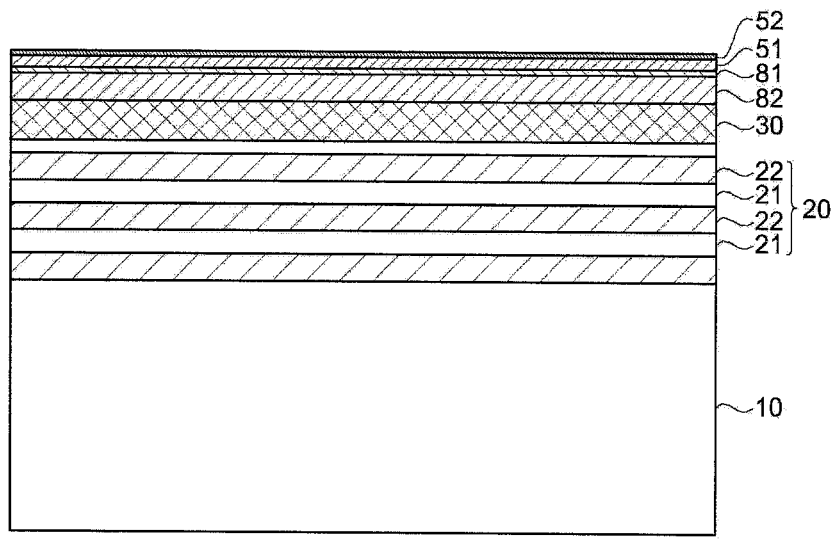
[FIG. 22b]
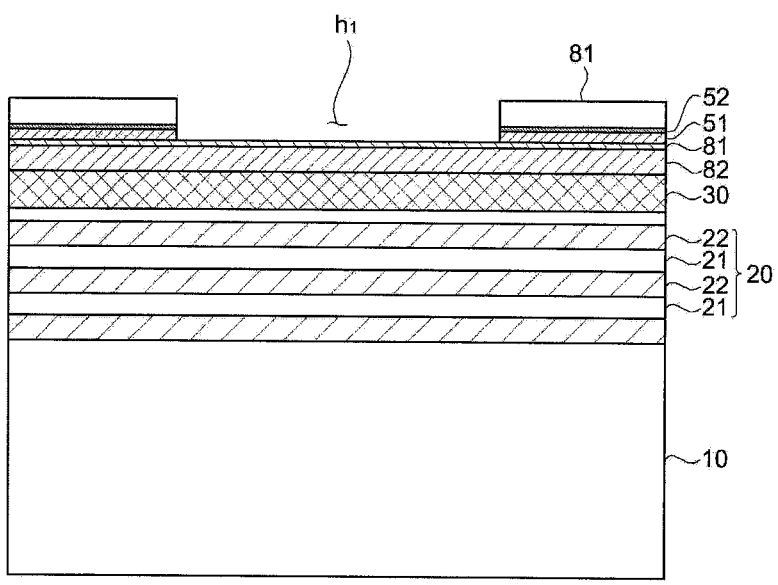

【FIG. 22c】
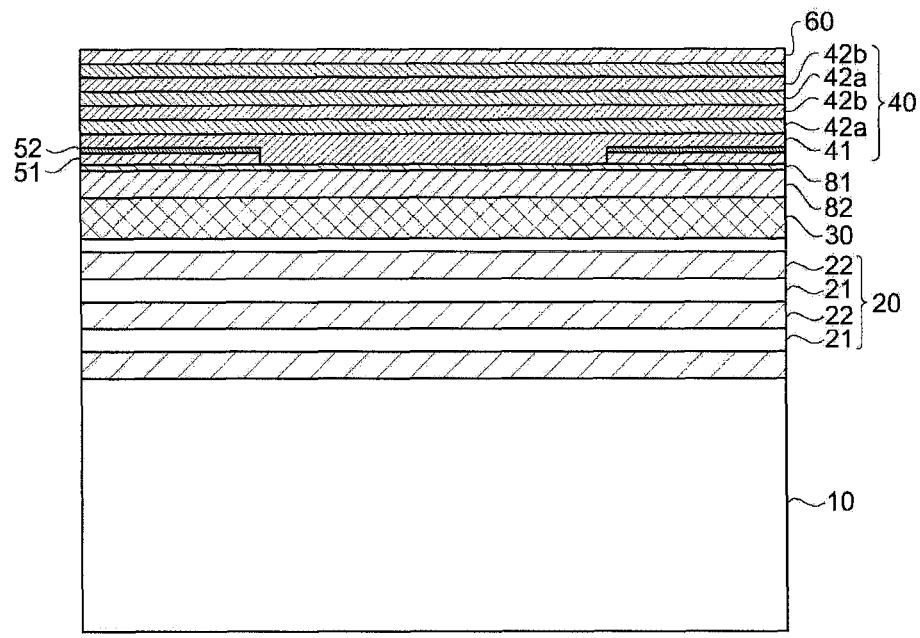
【FIG. 22d】
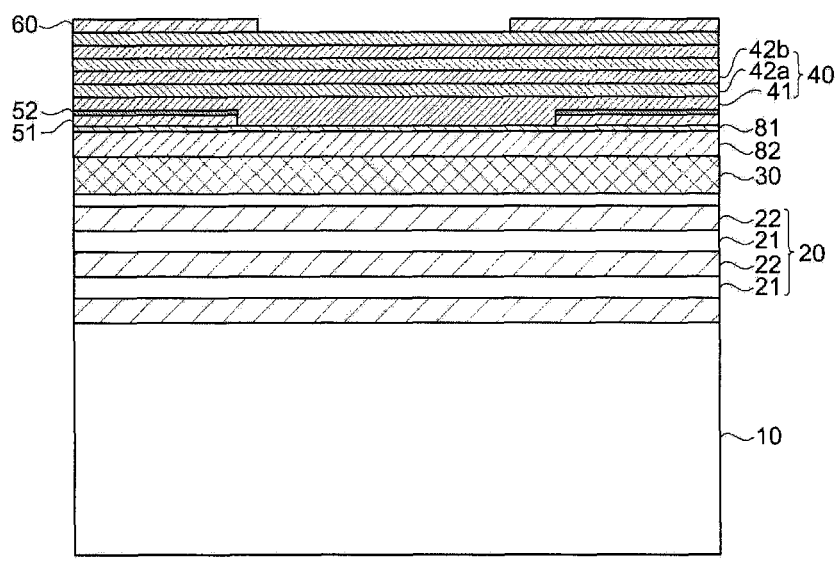

[FIG. 22e]
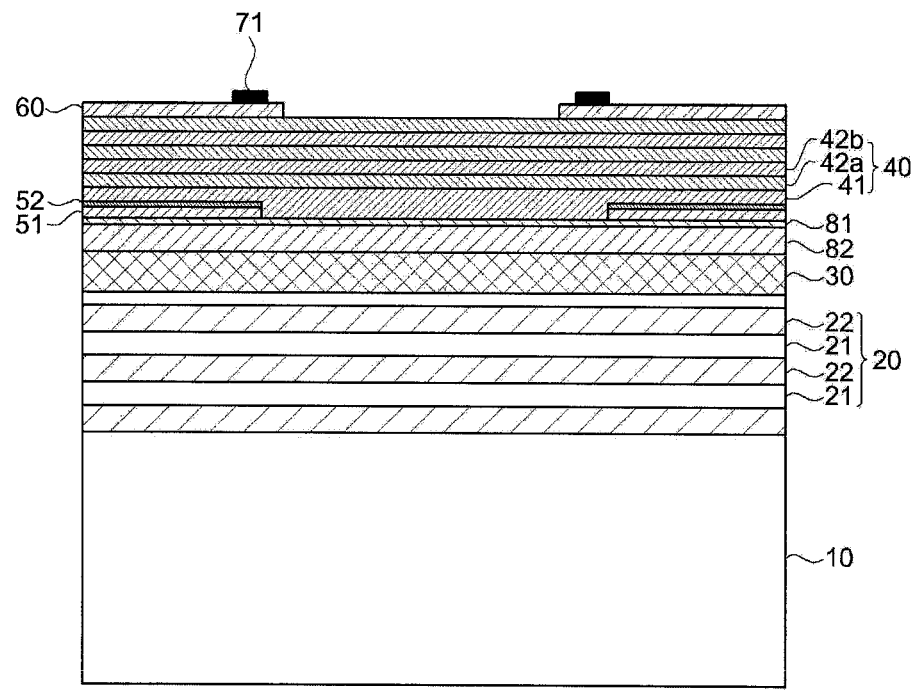
[FIG. 22f]
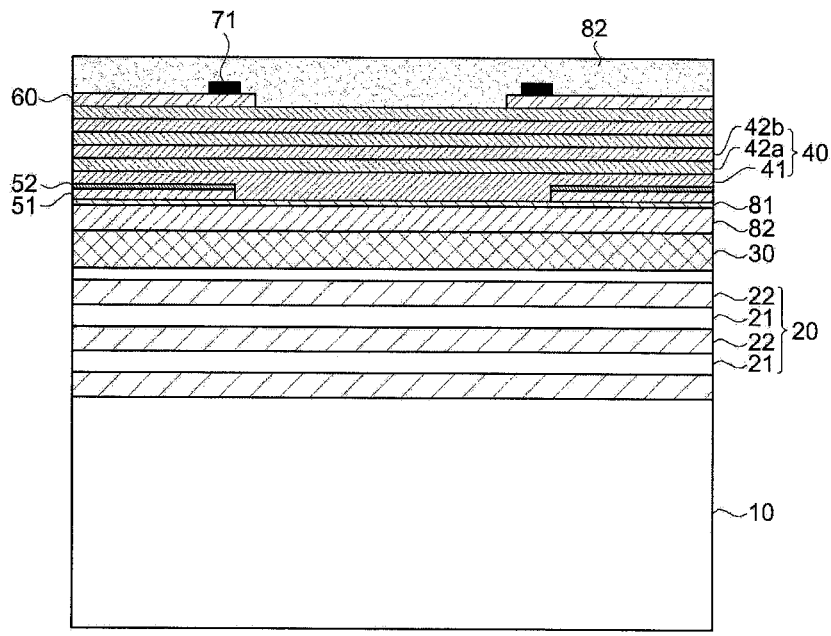

[FIG. 22g]
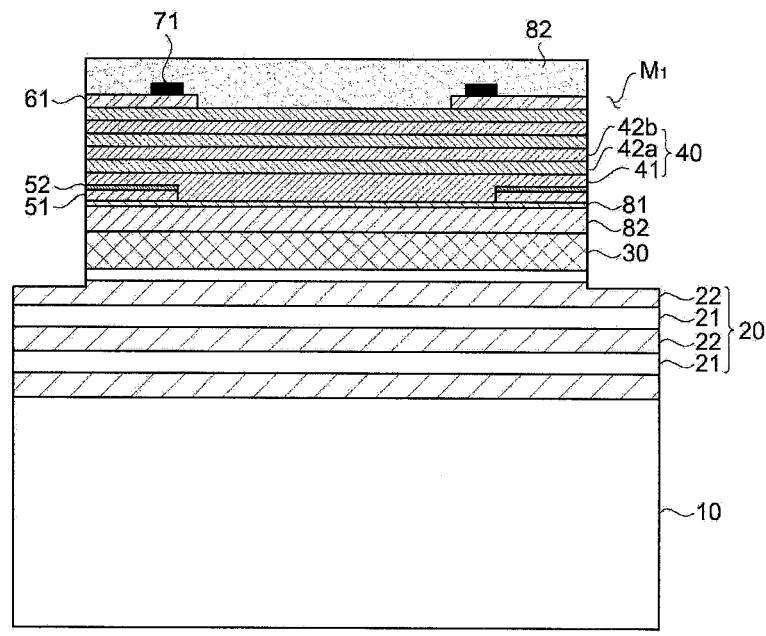
[FIG. 22h]
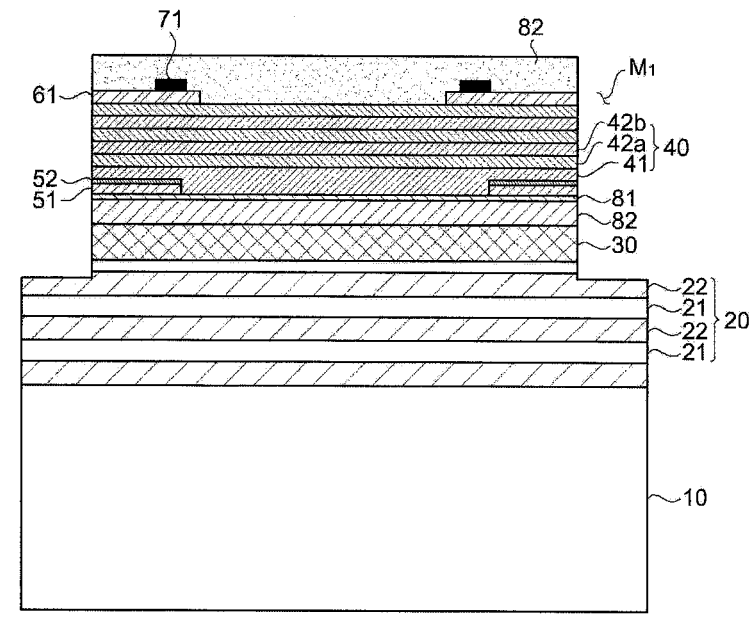

[FIG. 22i]
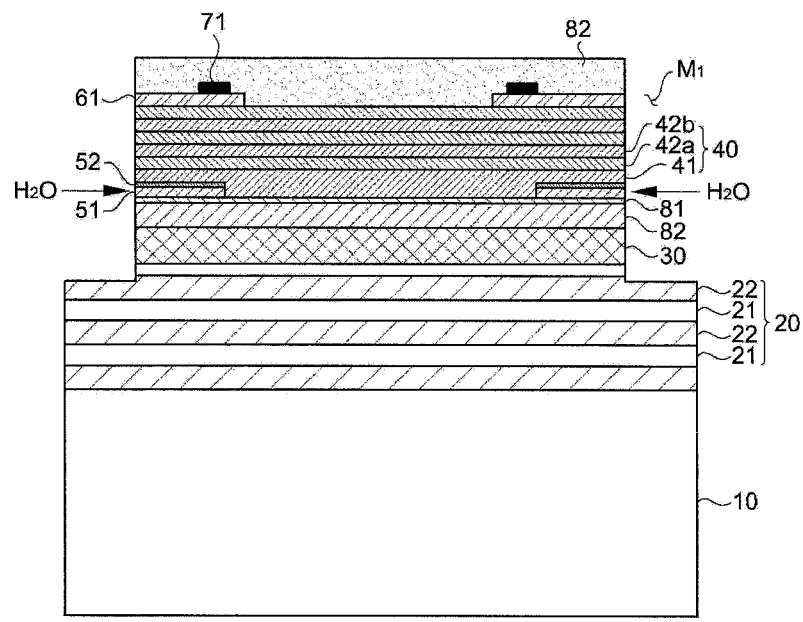
[FIG. 22j]
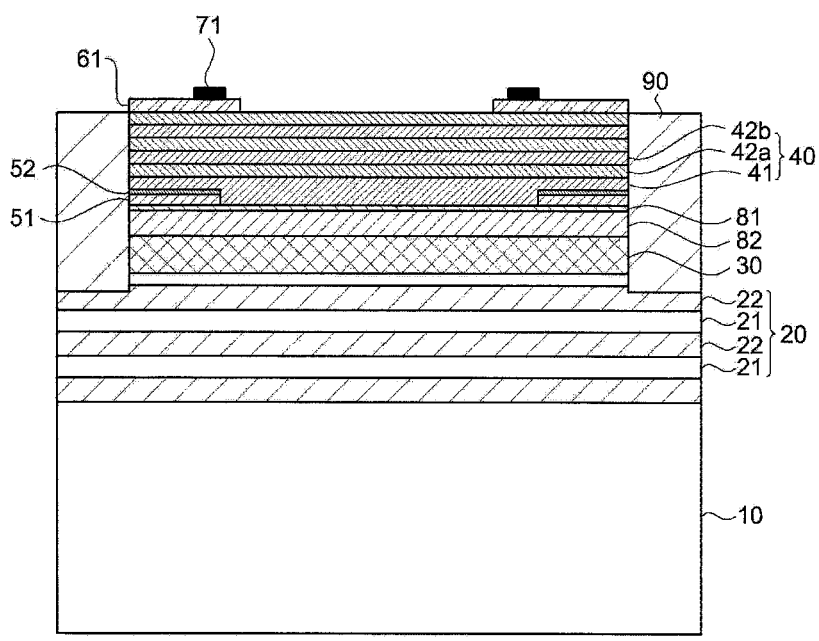

[FIG. 22k]
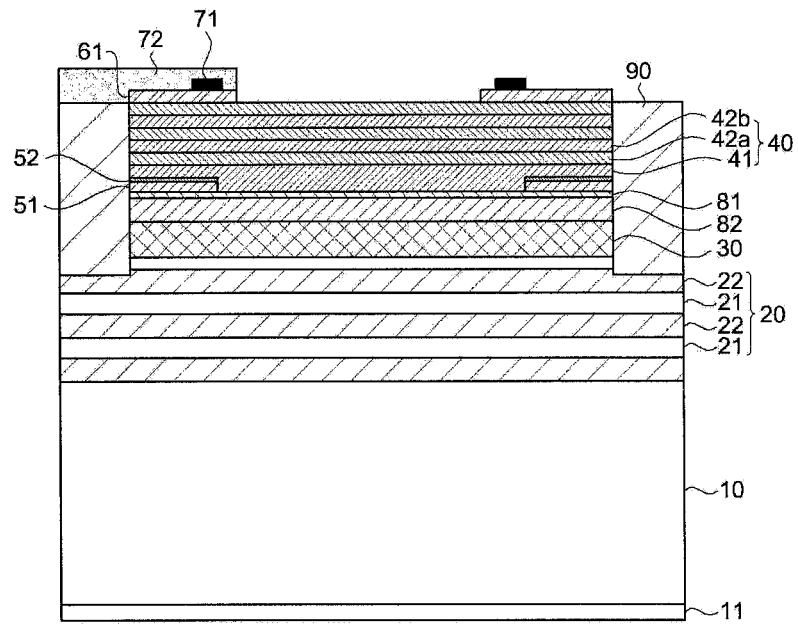
[FIG. 23a]
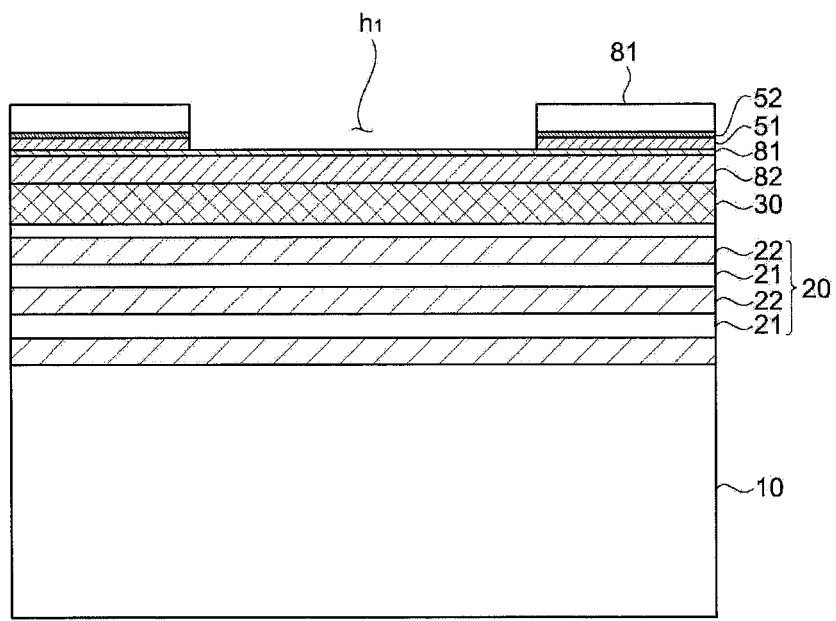

[FIG. 23b]
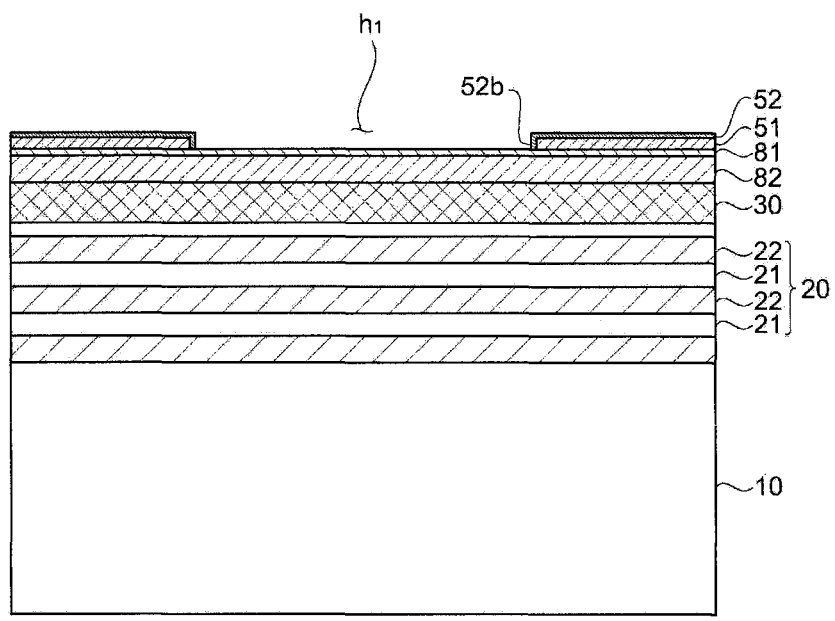
[FIG. 23c]
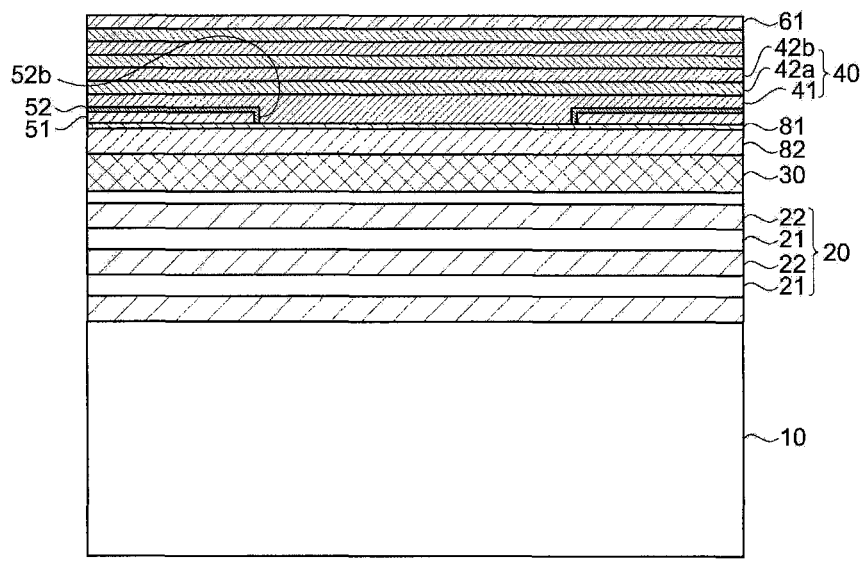

[FIG. 24]
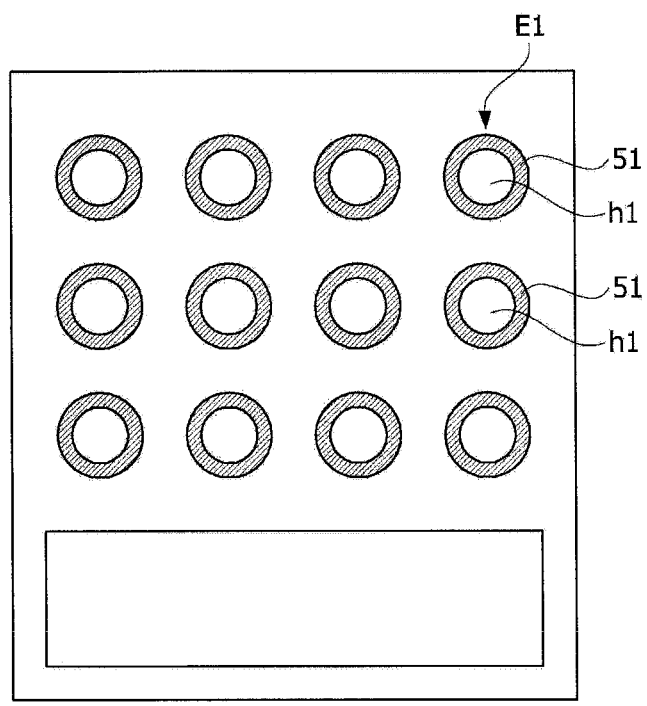

VERTICAL CAVITY SURFACE EMITTING LASER AND METHOD FOR MANUFACTURING SAME

TECHNICAL FIELD

Embodiments of the present disclosure relate to a vertical cavity surface emitting laser and a method for manufacturing the same.

BACKGROUND ART

Significant advances in commercially available vertical cavity surface emitting lasers (VCSELs) have been made due to the introduction of oxide apertures.

An oxide aperture may be formed by an oxidation process in which an AlGaAs material is transformed into an $AlO_x$:As form as a result of chemical reaction of $H_2O$ molecules with the AlGaAs material while an AlGaAs layer is exposed to a high-temperature $N_2$ and $H_2O$ mixed gas atmosphere and the $H_2O$ molecules are diffused inside the AlGaAs layer.

Since such a chemical oxidation process is highly dependent on processing conditions such as an Al content of an AlGaAs layer, a content of water vapor, a temperature of a reaction chamber, and the like, it is difficult to precisely control shapes and sizes of oxide apertures in a lateral direction. Therefore, there is a problem in that it is difficult to uniformly form oxide apertures on the same wafer.

Currently, formation of oxide apertures is precisely controlled using an expensive commercial manufacturing process apparatus. However, fundamental problems are not solved yet, and only production costs are increased. In addition, there is a problem in that an error of 1 μm or more occurs even when such a precise apparatus is used. [See M. Grabherr, D. Wiedenmann, R. Jaeger, and R. King, "Fabrication and performance of tunable single-mode VCSELs emitting in the 750 to 1,000 nm range," Proc. SPIE 5737, 120-128 (2005)]. Generally, since a diameter of an oxide aperture of a VCSEL device ranges from about 3 to 10 μm, a process error of 1 μm may significantly degrade a yield of the device.

Further, work efficiency may be extremely lowered because an oxidation process should be performed on wafers one by one for precise control.

DISCLOSURE

Technical Problem

Embodiments of the present disclosure are directed to providing a vertical cavity surface emitting laser with a uniform oxide aperture.

Embodiments of the present disclosure are also directed to providing a method for manufacturing a vertical cavity surface emitting laser capable of easily and precisely controlling an oxide aperture by automatically terminating formation of the oxide aperture.

It should be noted that objects of the present disclosure are not limited to the above-described objects, and other objects of the present disclosure will be apparent to those skilled in the art from the following descriptions.

Technical Solution

One aspect of the present disclosure provides a vertical cavity surface emitting laser which includes a substrate, a lower reflective layer disposed on the substrate, an active layer disposed on the lower reflective layer, an oxide layer disposed on the active layer and including a first hole formed at the center thereof, a capping layer disposed on the oxide layer, and an upper reflective layer disposed on the capping layer and the first hole.

The upper reflective layer may include a stepped portion disposed on the first hole.

The upper reflective layer may include a plurality of first upper reflective layers and a plurality of second upper reflective layers, wherein the plurality of first upper reflective layers and the plurality of second upper reflective layers may be alternately disposed, and the first upper reflective layer may have a refractive index higher than that of the second upper reflective layer.

The stepped portion of the upper reflective layer may become narrower as a distance from the first electrode decreases.

The upper reflective layer may include a first groove formed in an outermost layer thereof, and the first groove may have a diameter smaller than that of the first hole.

The vertical cavity surface emitting laser may further include a capping layer disposed between the oxide layer and the upper reflective layer.

The capping layer may include an extended portion configured to extend along an inner wall of the first hole.

A thickness of the extended portion may be smaller than a thickness of the capping layer.

The vertical cavity surface emitting laser may further include a second electrode disposed below the substrate.

The first electrode may include a second hole formed at a center thereof, and a diameter of the first hole may be greater than a diameter of the second hole.

Advantageous Effects

According to embodiments, since an oxidation process for forming an oxide aperture is automatically terminated, the instability of a wet oxidation process can be improved.

Further, even when an inexpensive wet oxidation process apparatus is used, the size adjustment of the oxide aperture can be remarkably easily and stably controlled. Further, several tens of wafers can be simultaneously processed in one process.

Therefore, a manufacturing process of a vertical cavity surface emitting laser can be simplified and process productivity can be significantly improved. Further, a size adjustment yield of the oxide aperture can be significantly improved.

Various and advantageous advantages and effects of the present disclosure are not limited to the above descriptions and can be more easily understood in describing a specific embodiment of the present disclosure.

DESCRIPTION OF DRAWINGS

FIG. 1 is a conceptual view of a laser device according to a first embodiment of the present disclosure.

FIG. 2 is a partially enlarged view of FIG. 1.

FIG. 3 is a view showing a method of forming an oxide aperture in a conventional semiconductor device.

FIG. 4 shows a first modification of FIG. 2.

FIG. 5 shows a second modification of FIG. 2.

FIG. 6 shows a third modification of FIG. 2.

FIG. 7 is a graph showing measured reflectance for a light-emitting region in a central portion of the laser device without an oxide layer according to the embodiment of the present disclosure.

FIG. 8 is a graph showing measured refractive index and electric field intensity of an 850 nm laser device according to the embodiment of the present disclosure.

FIG. 9 is a graph showing a measured phase shift angle of the laser device according to the embodiment of the present disclosure.

FIGS. 10A to 10K are views showing a method for manufacturing the laser device according to the first embodiment of the present disclosure.

FIGS. 11A to 11C are views showing a modification of the method for manufacturing the laser device according to the first embodiment of the present disclosure.

FIG. 12 is a conceptual view showing a laser device according to a second embodiment of the present disclosure.

FIG. 13 is a partially enlarged view of FIG. 12.

FIG. 14 is a view showing a method of forming an oxide aperture in a conventional semiconductor device.

FIG. 15 is a view showing an example of a process of filling a first hole with an epitaxial layer which is grown on the first hole.

FIG. 16 is a graph showing a growth rate of the epitaxial layer which is grown on the first hole.

FIG. 17 shows a first modification of FIG. 13.

FIG. 18 shows a second modification of FIG. 13.

FIG. 19 shows a third modification of FIG. 13.

FIG. 20 is a graph showing reflectance of a 980 nm laser device according to the embodiment of the present disclosure.

FIG. 21 is a graph showing refractive index and electric field intensity of the laser device according to the embodiment of the present disclosure.

FIGS. 22A to 22K are views showing a method for manufacturing the laser device according to the second embodiment of the present disclosure.

FIGS. 23A to 23C are views showing a modification of the method for manufacturing the laser device according to the second embodiment of the present disclosure.

FIG. 24 is a conceptual view showing a laser array according to an embodiment of the present disclosure.

MODES OF THE INVENTION

While the present disclosure is susceptible to various modifications and alternative forms, specific embodiments thereof are shown by way of example in the drawings and will herein be described in detail. However, it should be understood that there is no intent to limit the present disclosure to the particular forms disclosed, and on the contrary, the present disclosure is to cover all modifications, equivalents, and alternatives falling within the spirit and scope of the present disclosure.

It should be understood that, although the terms "first," "second," etc. may be used herein to describe various elements, these elements are not to be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a" and "an" are intended to include the plural forms as well unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings, the same or corresponding components are denoted by the same reference numerals regardless of reference numbers, and thus the description thereof will not be repeated.

FIG. 1 is a conceptual view of a laser device according to an embodiment of the present disclosure, FIG. 2 is a partially enlarged view of FIG. 1, FIG. 3 is a view showing a method of forming an oxide aperture in a conventional semiconductor device, FIG. 4 shows a first modification of FIG. 2, FIG. 5 shows a second modification of FIG. 2, and FIG. 6 shows a third modification of FIG. 2.

Referring to FIGS. 1 and 2, the laser device according to the embodiment may include a substrate 10, a lower reflective layer 20 disposed on the substrate 10, a laser cavity 30 disposed on the lower reflective layer 20, an oxide layer 51 including a first hole h1 formed at a center thereof, an upper reflective layer 40-2 disposed on the oxide layer 51 and the first hole h1, a first electrode 71 disposed on the upper reflective layer 40-2, and a second electrode 11 disposed below the substrate 10.

A semiconductor structure of the laser device may be manufactured using a metal-organic chemical vapor deposition (MOCVD) method, a liquid phase epitaxy (LPE) method, a molecular beam epitaxy (MBE) method, and the like, but the present disclosure is not limited thereto.

The substrate 10 may be a semi-insulating or conductive substrate. For example, the substrate 10 may be a GaAs substrate having a high doping concentration, and the doping concentration may range from about $1 \times 10^{17}$ cm$^{-3}$ to $1 \times 10^{19}$ cm$^{-3}$. A semiconductor buffer layer such as an AlGaAs or GaAs thin film may be further disposed on the substrate 10 as necessary, but the present disclosure is not necessarily limited thereto.

The lower reflective layer 20 may include a distributed Bragg reflector (DBR) having an n-type superlattice structure. The lower reflective layer 20 may be epitaxially deposited on the substrate 10 by the methods such as the MOCVD method, the MBE method, and the like described above.

The lower reflective layer 20 may perform an internal reflection function in a vertical cavity surface emitting laser (VCSEL) structure. The lower reflective layer 20 may include a plurality of first lower reflective layers 21 and a plurality of second lower reflective layers 22 alternately stacked. All of the first lower reflective layers 21 and the second lower reflective layers 22 may include AlGaAs, and an aluminum composition of the first lower reflective layers 21 may be higher than that of the second lower reflective layers 22.

The first lower reflective layers 21 and the second lower reflective layers 22 constituting the lower reflective layer 20 may have an effective optical thickness of about ¼ of a wavelength of light generated by a VCSEL and may have reflectance of about 100% overall if possible for high internal reflection of the VCSEL.

The first lower reflective layers 21 and the second lower reflective layers 22 may have an effective optical thickness of about ¼ of the wavelength of the light generated by the VCSEL (an effective optical thickness=a target light wavelength/(4×a refractive index of a material)). Further, the first lower reflective layers 21 and the second lower reflective layers 22 may have reflectance of about 100% for high internal reflection of the VCSEL.

The reflectance of the lower reflective layer 20 may depend on a difference in refractive index between the first lower reflective layer 21 and the second lower reflective layer 22 constituting an inside of the lower reflective layer 20 and the number of stacked layers of the first lower reflective layers 21 and the second lower reflective layers 22. Therefore, a high reflectance may be obtained as the difference in the refractive index increases and the number of stacked layers decreases.

Further, in order to reduce electrical resistance, an Al-graded AlGaAs layer in which an Al composition ratio of the first lower reflective layer 21 and the second lower reflective layer 22 is one-dimensionally or two-dimensionally changed continuously may be positioned between the first lower reflective layer 21 and the second lower reflective layer 22.

The laser cavity 30 may include an active layer composed of one or more quantum well layers and barrier layers. The quantum well layer may include any one selected from GaAs, AlGaAs, AlGaAsSb, InAlGaAs, AlInGaP, GaAsP, and InGaAsP, and the barrier layer may include any one selected from AlGaAs, InAlGaAs, InAlGaAsP, AlGaAsSb, GaAsP, GaInP, AlInGaP, and InGaAsP.

The laser cavity 30 may be designed to provide sufficient optical gain for the laser device. For example, the laser cavity 30 according to the embodiment may have a quantum well layer having a thickness and composition ratio suitable for emitting light of a wavelength band of about 850 nm or about 980 nm at a center thereof. However, the wavelength band of the laser output by the quantum well layer is not particularly limited.

The laser cavity 30 may include a first semiconductor layer (not shown) disposed below the active layer and a second semiconductor layer (not shown) disposed above the active layer. The first semiconductor layer may be an n-type semiconductor layer and the second semiconductor layer may be a p-type semiconductor layer, but the present disclosure is not necessarily limited thereto. The first semiconductor layer and the second semiconductor layer may not be doped with a dopant. For example, the first semiconductor layer and the second semiconductor layer may include AlGaAs, but the present disclosure is not limited thereto.

The oxide layer 51 may be disposed on the laser cavity 30. The oxide layer 51 may be doped with the same type of dopant as the upper reflective layer 40-2. For example, the oxide layer 51 may be doped with a p-type dopant at a concentration of about $10^{18}$ cm$^{-3}$, but the present disclosure is not necessarily limited thereto.

The oxide layer 51 may include a semiconductor compound containing aluminum, such as AlAs, AlGaAs, InAlGaAs, or the like. The oxide layer 51 according to the embodiment may include the first hole h1 formed at the center thereof. That is, the oxide layer 51 may have a donut shape in which a hole is formed at a center thereof. Since the oxide layer 51 has a relatively high resistance and a relatively low refractive index, the oxide layer 51 may allow current to pass through the first hole h1 and allow laser light to be collected toward a center of the device. The upper reflective layer 40-2 may be disposed in the first hole h1 to form a stepped portion 43. Further, light generated in the quantum well layer may be amplified in a round-trip manner in a second hole h2 region, and laser light may be emitted to the layers disposed above the second hole h2. That is, the first hole h1 may serve as a light-transmitting layer.

Referring to FIG. 3, in a conventional laser structure, a sidewall of an oxide layer 1 is exposed and oxidized. The oxidation may be gradually performed from the sidewall of the oxide layer 1 toward a center thereof An oxidized outer portion 1a may be increased in resistance and an unoxidized central portion 1b may function as an oxide aperture through which current or light passes.

However, a degree of oxidation of the oxide layer 1 may be affected by various conditions, such as a composition of a semiconductor compound contained in the oxide layer 1, an orientation of the compound, a thickness of the layer, an oxidation process, and the like. That is, it is very difficult to precisely control the oxide aperture.

However, in some embodiments, the first hole h1 and the upper reflective layer 40-2 which are disposed in the first hole h1 may serve as stoppers so as to automatically terminate the oxidation. That is, even when the oxidation conditions are changed, when an entirety of the oxide layer 51 in which the first hole h1 is formed is oxidized, the region which will be oxidized no longer exists. Therefore, there is an advantage in that an oxide aperture corresponding to a diameter of the first hole h1 may be obtained even when the degree of oxidation is not precisely controlled. Therefore, a manufacturing process may be simplified and a yield may be improved. Further, it is not necessary to finely control a termination time point of the oxidation so that it is possible to oxidize several tens of wafers by one oxidation process and a production speed may be increased.

Therefore, the conditions required for an oxidation reaction to occur well in the oxide layer 51 according to the embodiment may be changed. For example, the oxidation reaction may occur well as a thickness of the oxide layer 51 increases, an aluminum composition increases, and a doping concentration increases.

The thickness of the oxide layer 51 may range from 50 Å to 5,000 Å. When the thickness of the oxide layer 51 is smaller than 50 Å, there is a problem in that an oxidation rate is too low and a process time becomes too long, and when the thickness is greater than 5,000 Å, there is a problem in that cracks are generated at an end of the oxide aperture due to thickness shrinkage after oxidation.

The doping concentration of the oxide layer 51 may range from $1\times10^{15}$ cm$^{-3}$ to $1\times10^{20}$ cm$^{-3}$. When the doping concentration of the oxide layer 51 is smaller than $1\times10^{15}$ cm$^{-3}$, there is a problem in that the oxidation rate is lowered and the process becomes longer, and when the doping concentration is greater than $1\times10^{20}$ cm$^{-3}$, there is a high risk of cracks being generated due to an increase in internal defects.

The aluminum composition of the oxide layer 51 may range from 80% to 100%. When the aluminum composition of the oxide layer 51 is 80% or less, there is a problem in that the oxidation rate is lowered and the process becomes longer.

A capping layer 52 may be disposed on the oxide layer 51. The capping layer 52 may serve to protect the oxide layer from being exposed to an external environment during or after the process. As described above, the oxide layer 51 may be designed to have a high aluminum composition and a high doping concentration so as to be easily oxidized. Therefore, when there is no capping layer 51, the oxide layer 51 may have already been oxidized before the oxidation process is performed thereon. The growth of the upper reflective layer may be difficult because the semiconductor layer is difficult to grow on the oxide layer 51 which is already oxidized. Therefore, the capping layer 52 may prevent the oxide layer from being oxidized prior to the oxidation process.

The oxide layer 51 according to the embodiment may include a semiconductor compound containing aluminum, such as AlAs, AlGaAs, InAlGaAs, or the like so that the upper reflective layer 20 may be regrown thereon. That is, the oxide layer according to the embodiment may include arsenic (As) so that a semiconductor layer may be grown thereon.

The capping layer 52 may include at least one selected from GaAs, InAlGaAs, AlGaAsSb, AlGaAsP, GaInP, InGaAsP, and AlInGaP, but the present disclosure is not necessarily limited thereto.

When the capping layer 52 includes aluminum, an aluminum composition of the capping layer 52 may be smaller than the aluminum composition of the oxide layer 51. For example, the aluminum composition of the capping layer 52 may range from 0% to 60%. When the aluminum composition of the capping layer 52 is greater than 60%, a surface of the capping layer 52 may be exposed to air and oxidized during the process, and the capping layer 52 may also be oxidized while the oxide layer 51 is oxidized even after the upper reflective layer 20 is formed.

A thickness of the capping layer 52 may range from 2.5 Å to 5,000 Å. When the thickness of the capping layer 52 is 2.5 Å or less, there is a problem in that the capping layer 52 is too thin to effectively block the penetration of oxygen, and when the thickness is 5,000 Å or more, there is a problem in that a step is too large while the upper reflective layer 20 is regrown so that it is difficult to form a uniform interface.

Referring to FIG. 4, the capping layer 52 may include an extended portion 52a extending along an inner wall of the first hole h1 of the oxide layer 51. In this case, the extended portion may suppress the occurrence of interface defects between the first upper reflective layer 41b and the oxide layer 51 which are disposed in the first hole h1. A minimum thickness of the extended portion 52a may range from 2.5 Å to 2,000 Å. When the thickness of the extended portion 52a is 2.5 Å or less, there is a problem in that the occurrence of interface defects may not be suppressed between the upper reflective layer 40-2 and the oxide layer 51, and when the thickness is 2,000 Å or more, a problem may occur in the uniformity of reflective films which are grown near a side surface of the oxide layer 51 when the upper reflective layer 40-2 is grown.

The extended portion 52a may be formed by moving a material at an edge into the relatively low first hole h1 when the material is thermally treated at a high temperature in a $PH_3$ atmosphere (an InGaP or InGaAsP-based material) or an $AsH_3$ atmosphere (a GaAs-based material) after the capping layer 52 is formed on the oxide layer 51.

Referring to FIG. 5, the inner wall of the first hole h1 may have an inclined surface 53. The inclination of the inner wall may be unintentionally formed during an etching process. However, the inclination of the inner wall of the first hole h1 may be intentionally formed. When the first hole h1 has the inclined surface 53, there is an advantage in that the upper reflective layer 40-2 may be easily formed thereon.

An inclined angle $\theta_1$ of the inner wall of the first hole h1 may range from 35.5° to 87° when the diameter of the first hole h1 is 10 μm. When the inclined angle is smaller than 35.5°, the light output may be significantly lowered due to a diameter of the second hole h2 becoming 1 μm or less, and when the inclined angle is greater than 87°, each layer of the upper reflective layer 40-2 may not be uniformly formed on the inner wall of the first hole h1.

The inclined angle $\theta_1$ of the inner wall of the first hole h1 may range from 35.5° to 87° when the diameter of the first hole h1 is 15 μm. When the inclined angle is smaller than 24.5°, the light output may be significantly lowered due to the diameter of the second hole h2 becoming 1 μm or less, and when the inclined angle is greater than 87°, each layer of the upper reflective layer 40-2 may not be uniformly formed on the inner wall of the first hole h1.

Referring to FIG. 6, a light-transmitting layer 54 may be further disposed in the first hole h1 of the oxide layer 51. The light-transmitting layer 54 may be made of a material having conductivity to facilitate current injection and having a high transmittance so that light emitted from the laser cavity 30 in which the active layer is positioned at the center thereof may be emitted well. For example, the light-transmitting layer 54 may include a semiconductor compound such as InAlGaAs, InAlGaP, InGaAsP, or ZnSeS, but the present disclosure is not necessarily limited thereto.

Referring again to FIG. 2, the upper reflective layer 40-2 may be disposed above the capping layer 52 and the first hole h1. The upper reflective layer 40-2 may include first upper reflective layers 41b and second upper reflective layers 42b in the same manner as the lower reflective layer 20.

All of the first upper reflective layers 41b and the second upper reflective layers 42b may have a composition of AlGaAs, and an aluminum composition of the first upper reflective layer 41b may be higher than that of the second upper reflective layers 42b.

The upper reflective layer 40-2 may be doped to have a polarity different from that of the lower reflective layer 20. For example, when the lower reflective layer 20 and the substrate 10 are doped with an n-type dopant, the upper reflective layer 40-2 may be doped with a p-type dopant.

The upper reflective layer 40-2 may have fewer layers than the lower reflective layer 20 to lower reflectance from the VCSEL. That is, the reflectance of the upper reflective layer 40-2 may be smaller than that of the lower reflective layer 20.

The upper reflective layer 40-2 may include a stepped portion 43 disposed on the first hole h1. The stepped portion 43 may be defined as a region which is bent by the first hole h1 and disposed lower than an edge region. A thickness of the stepped portion 43 may correspond to a depth of the first hole h1, but the present disclosure is not necessarily limited thereto.

The stepped portion 43 of the upper reflective layer 40-2 may become smaller as a distance from the oxide layer 51 increases. A diameter of the stepped portion 43 may be reduced by a thickness of each layer as the number of stacked layers of the upper reflective layer 40-2 increases. Therefore, a first groove 44 having the smallest step may be disposed on an outermost layer of the upper reflective layer 40-2. A diameter of the first groove 44 may be smaller than the diameter of the first hole h1. A depth of the first groove 44 may be less than or equal to the depth of the first hole h1.

The reflectance of the upper reflective layer may be designed based on the thickness up to an upper surface of the first groove. In this case, a region in which the first groove 44 is disposed may be defined as a region S1 (an in-phase region) in which light is propagated and amplified, and an outer region of the first groove 44 may be defined as a region S2 (an anti-phase region) in which no light is propagated.

In some embodiments, the diameter of the first hole h1 may be greater than the diameter of the first groove 44. Since most laser light is propagated in the region S1, an end of the first hole h1 does not affect the light propagation and amplification regions. Therefore, optical scattering and light absorption may be minimized at the end of the first hole h1. Therefore, light efficiency may be increased and the lifetime of the device may also be improved as compared with the conventional structure.

When the first hole h1 is disposed in an inside of the region S1 in which the light is propagated or the diameter of the first hole h1 is equal to a diameter of the region S1, there is a problem in that the light may be scattered or absorbed at the end of the first hole h1.

The diameters of the first groove 44 and the second hole h2 may range from 6% to 98% of the diameter of the first hole h1 on the basis of 100% of the diameter of the first hole h1. Typically, a diameter of an oxide aperture ranges from about 5 to 15 μm. In this case, when the diameters are smaller than 6%, the light output is significantly lowered due to the diameter of the first groove 44 becoming 1 μm or less, and when the diameters are greater than 98%, each layer of the upper reflective layer 40-2 may be unevenly formed and each layer may be locally broken.

An intermediate layer 40-1 may be disposed below the oxide layer 51. That is, the oxide layer 51 and the capping layer 52 may be disposed between the upper reflective layer 40-2 and the intermediate layer 40-1. Such a structure has an advantage in that the laser cavity 30 may be protected. Generally, when the oxide layer 51 is oxidized, a material may be amorphized and film quality may be slightly lowered. Accordingly, when an amorphized layer in which film quality is slightly lowered is brought into direct contact with the laser cavity in which light is generated, the reliability of the device may be degraded. Therefore, the intermediate layer 40-1 may be formed prior to the oxide layer to prevent the amorphized layer from being brought into direct contact with the laser cavity.

A composition of the intermediate layer 40-1 may be the same as that of the upper reflective layer 40-2. For example, a composition of the first intermediate layer 41a may be the same as that of the first upper reflective layer 41b, and a composition of the second intermediate layer 42a may be the same as that of the second upper reflective layer 42b. That is, the intermediate layer 40-1 may be a portion of the upper reflective layer 40-2. Therefore, a total reflectance of the upper reflective layer 40-2 may be controlled together with the thickness of the intermediate layer 40-1.

In this case, the intermediate layer 40-1 may have no stepped portion 43, while the upper reflective layer 40-2 which is regrown on the oxide layer 51 may have the stepped portion 43.

The first electrode 71 may be disposed on the upper reflective layer 40-2 and the second electrode 11 may be disposed below the substrate 10. However, the present disclosure is not limited thereto, and an upper portion of the substrate 10 may be exposed and then the second electrode 11 may be disposed in the exposed region.

The first electrode 71 and the second electrode 11 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present disclosure is not limited to the above materials.

For example, the first electrode 71 may have a plurality of metal layers (e.g., Ti/Pt/Au). In this case, a thickness of Ti may range from about 100 Å to 400 Å and a thickness of Au may range from 3,000 Å to 20,000 Å, but the present disclosure is not necessarily limited thereto.

The second electrode 11 may have a plurality of metal layers (e.g., AuGe/Ni/Au). In this case, a thickness of AuGe may be 1,000 Å, a thickness of Ni may be 100 Å, and a thickness of Au may be 2,000 Å, but the present disclosure is not necessarily limited thereto.

An ohmic layer 61 may be further disposed between the first electrode 71 and the upper reflective layer 40-2. The ohmic layer 61 may include a material having a band gap lower than or equal to a band gap of a GaAs substrate and lower than or equal to energy of the emitted laser light for low ohmic resistance. For example, the ohmic layer 61 may include any one selected from AlInGaAs, InGaAs, GaAs, AlInGaAsSb, AlInGaAsPSb, InGaAsP, InGaAsPSb, GaAsSb, InGaAsSb, InAsSb, AlGaAsSb, AlGaAsP, and AlGaInAsP. In some embodiments, the second hole h2 formed in the ohmic layer 61 may have a diameter corresponding to that of the first groove 44. That is, since the ohmic layer 61 is disposed in a region in which no light is propagated, the ohmic layer 61 may not affect the light output.

FIG. 7 is a graph showing measured reflectance of the laser device according to the embodiment of the present disclosure, FIG. 8 is a graph showing measured refractive index and electric field intensity of the laser device according to the embodiment of the present disclosure, and FIG. 9 is a graph showing a measured phase shift angle of the laser device according to the embodiment of the present disclosure.

FIG. 7 shows a reflectance spectrum of a structure in which the reflectance of the upper reflective layer 40-2 at about 850 nm is about 99.5% and the reflectance of the lower reflective layer 20 is about 99.9%. Therefore, laser light of 850 nm amplified between the lower reflective layer 20 and the upper reflective layer 40-2 may be emitted through the upper reflective layer 40-2.

Referring to FIG. 8, an interface (a boundary surface indicated by a dotted line), which is regrown on the capping layer 52, the side surface of the oxide layer 51, and a portion 42a of the upper reflective layer may be disposed in a valley portion of a standing wave, and thus light loss in the laser device due to the regrowth interface may be minimized. In this case, an Al composition ratio of an uppermost layer 42a of the intermediate layer 40-1 may be as low as possible to have almost the same band gap as the energy of the emitted laser light to minimize a surface oxidation problem caused by Al during regrowth. That is, the Al composition of the uppermost layer 42a of a portion of the intermediate layer 40-1 may be about 5% of that in the case of the 850 nm laser wavelength. Further, an Al composition of the regrown first layer 42b of the upper reflective layer 40-2 may range from 5% to 25% of that in the case of the 850 nm laser wavelength.

Referring to FIG. 9, it can be confirmed that the laser light is disposed in a light propagation region (an in-phase region) with respect to the center of the laser cavity 30 at 850 nm.

FIGS. 10A to 10K are views showing a method for manufacturing a laser device according to an embodiment of the present disclosure.

Referring to FIG. 10A, a substrate 10, a lower reflective layer 20, a laser cavity 30, an upper reflective layer 40-2, an oxide layer 51, and a capping layer 52 may be sequentially formed. Characteristics of each of the layers may be applied as they are to the above-mentioned configurations.

Referring to FIG. 10B, a first hole h1 may be formed at a center of the capping layer 52 and the oxide layer 51 by disposing a first mask on the capping layer 52 and then etching. The first mask 81 may include $SiO_2$, $Si_xO_y$, $Si_3N_4$, $Si_xN_y$, $SiO_xN_y$, $Al_2O_3$, $TiO_2$, AlN, or a photoresist, but the present disclosure is not necessarily limited thereto.

Referring to FIGS. 10C and 10D, the upper reflective layer 40-2 may be regrown on the oxide layer 51 and the first hole h1. Therefore, the oxide layer 51 may be disposed between an intermediate layer 40-1 and the upper reflective layer 40-1.

The upper reflective layer 40-2 disposed on the oxide layer 51 may include a stepped portion 43 disposed on the first hole h1. The stepped portion 43 may be disposed at a lower level than an edge region due to the first hole h1. A thickness of the stepped portion 43 may correspond to a depth of the first hole h1, but the present disclosure is not necessarily limited thereto.

The stepped portion 43 of the upper reflective layer 40-2 may become smaller as a distance from the oxide layer 51 increases. A diameter of the stepped portion 43 may be reduced by a thickness of each layer as the number of instances of stacking of the layers of the upper reflective layer 40-2 increases. Therefore, a first groove 44 may be disposed in an outermost layer of the upper reflective layer 40-2. A diameter of the first groove 44 may be smaller than a diameter of the first hole h1. A depth of the first groove 44 may be less than or equal to the depth of the first hole h1.

Thereafter, a second hole h2 may be formed by forming an entirety of an ohmic layer 61 on the upper reflective layer 40-2 and then removing a region corresponding to the first groove 44. In some embodiments, most laser light may be emitted through the second hole h2 without being incident on the ohmic layer 61. Therefore, the ohmic layer 61 may use a material having a band gap lower than or equal to that of a GaAs substrate and lower than or equal to the energy of the emitted laser light.

Referring to FIGS. 10E to 10H, a first electrode 71 may be formed on the ohmic layer 61, a second mask 82 may be formed on the first electrode 71, and then an edge region in which the second mask 82 is removed may be etched.

Referring to FIG. 10I, a side surface of the oxide layer 51 may be oxidized. In some embodiments, an aperture may be formed in which current is already injected due to the first hole h1 and through which light may be emitted, and thus it is not necessary to precisely control a degree of oxidation of the oxide layer 51. That is, when the entirety of the oxide layer 51 is oxidized, the oxidation process may be automatically terminated.

For example, the oxidation process may be performed by exposing a sample to a reaction tube provided with a $N_2$ and $H_2O$ mixed gas atmosphere within a temperature range of about 300° C. to 450° C. for about 30 to 50 minutes, but the present disclosure is not necessarily limited thereto. Further, the thickness, doping concentration, and aluminum composition of the oxide layer 51 according to the embodiment may be adjusted so that the oxidation of the oxide layer 51 is rapidly performed.

Referring to FIG. 10J, a protective layer 90 may be disposed in the etched edge region. The protective layer 90 may be made of various materials capable of protecting an outer side of the laser device. For example, the protective layer 90 may include at least one of $SiO_2$, $Si_3N_4$, SiON, $Ta_2O_5$, $HfO_2$, benzocyclobutene (BCB), and a polyimide, but the present disclosure is not necessarily limited thereto. Further, a process of curing the protective layer 90 may be further performed as necessary.

Referring to FIG. 10K, a pad electrode 72 connected to the first electrode 71 may be formed. Further, a second electrode 11 may be formed below the substrate 10.

FIGS. 11A to 11C are views showing a modification of the method for manufacturing the laser device according to the embodiment of the present disclosure.

Referring to FIGS. 11A and 11B, a substrate 10, a lower reflective layer 20, a laser cavity 30 including an active layer positioned at a center thereof, an upper reflective layer 40-2, an oxide layer 51, and a capping layer 52 may be sequentially formed. A first mask 81 may be disposed on the capping layer 52 and then etched to form a first hole h1 at a center of the capping layer 52 and the oxide layer 51.

Thereafter, the capping layer 52 may be formed above the oxide layer 51 and thermally treated to form an extended portion 52a of the capping layer 52 on an inner wall of the first hole h1. Specifically, when the capping layer 52 is formed above the oxide layer 51 and subjected to thermal treatment in a $PH_3$ (an InGaP or InGaAsP-based material) atmosphere or an $AsH_3$ (a GaAs-based material) atmosphere at a high temperature, a capping material present at the edge may move into the relatively low first hole h1 to form the extended portion 52a. In this case, the thermal treatment temperature may range from 500° C. to 900° C. According to the above configuration, the extended portion 52a may serve as a stopper so as to prevent the progress of oxidation.

Referring to FIG. 11C, the upper reflective layer 40-2 may be formed on the oxide layer 51 and the first hole h1. The subsequent processes may be performed in the same manner as those in FIGS. 10E to 10K.

FIG. 12 is a conceptual view showing a laser device according to another embodiment of the present disclosure, FIG. 13 is a partially enlarged view of FIG. 12, and FIG. 14 is a view showing a method of forming an oxide aperture in a conventional semiconductor device.

Referring to FIGS. 12 and 13, the laser device according to the embodiment may include a substrate 10, a lower reflective layer 20 disposed on the substrate 10, a laser cavity 30 disposed on the lower reflective layer 20, an oxide layer 51 including a first hole h1 formed at a center thereof, an upper reflective layer 40 disposed on the oxide layer 51 and the first hole h1, a first electrode 71 disposed on the upper reflective layer 40, and a second electrode 11 disposed below the substrate 10.

A semiconductor structure of the laser device may be manufactured using an MOCVD method, an LPE method, an MBE method, and the like, but the present disclosure is not limited thereto.

The substrate 10 may be a semi-insulating or conductive substrate. For example, the substrate 10 may be a GaAs substrate having a high doping concentration and the doping concentration may range from about $1 \times 10^{17}$ cm$^{-3}$ to $1 \times 10^{19}$ cm$^{-3}$. A buffer layer such as an AlGaAs or GaAs thin film may be further disposed on the substrate 10 as necessary, but the present disclosure is not necessarily limited thereto.

The lower reflective layer 20 may include a DBR having an n-type superlattice structure. The lower reflective layer 20 may be epitaxially deposited on the substrate 10 by the methods such as the MOCVD method, the MBE method, and the like described above.

The lower reflective layer 20 may perform an internal reflection function in a VCSEL structure. The lower reflective layer 20 may include a plurality of first lower reflective layers 21 and a plurality of second lower reflective layers 22 alternately stacked. All of the first lower reflective layers 21 and the second lower reflective layers 22 may include AlGaAs, and an aluminum composition of the first lower reflective layers 21 may be higher than that of the second lower reflective layers 22.

The first lower reflective layers 21 and the second lower reflective layers 22 may have an effective optical thickness of about ¼ of the wavelength of the light generated by the VCSEL (an effective optical thickness=a target wavelength/(4×a refractive index of material)). Further, the first lower reflective layers 21 and the second lower reflective layers 22 may have reflectance of about 100% for high internal reflection of the VCSEL.

The reflectance of the lower reflective layer 20 may depend on a difference in refractive index between the first lower reflective layer 21 and the second lower reflective layer 22 and the number of stacked layers of the first lower reflective layers 21 and the second lower reflective layers 22. Therefore, a high reflectance may be obtained as the difference in the refractive index increases and the number of stacked layers decreases.

The laser cavity 30 may include one or more well layer and barrier layers. The well layer may include any one selected from GaAs, AlGaAs, AlGaAsSb, InAlGaAs, AlInGaP, GaAsP, and InGaAsP, and the barrier layer may include any one selected from AlGaAs, InAlGaAs, InAlGaAsP, AlGaAsSb, GaAsP, GaInP, AlInGaP, and InGaAsP.

The laser cavity 30 may be designed to provide sufficient optical gain for the laser device. For example, the laser cavity 30 according to the embodiment may have a well layer having a thickness and composition ratio suitable for emitting light of a wavelength band of about 800 nm or about 900 nm at a center thereof. However, the wavelength band of the laser output by the well layer is not particularly limited.

The laser cavity 30 may include a first semiconductor layer (not shown) disposed below the active layer and a second semiconductor layer (not shown) disposed above the active layer. The first semiconductor layer may be an n-type semiconductor layer, and the second semiconductor layer may be a p-type semiconductor layer, but the present disclosure is not necessarily limited thereto. The first semiconductor layer and the second semiconductor layer may not be doped with a dopant. For example, the first semiconductor layer and the second semiconductor layer may include AlGaAs, but the present disclosure is not limited thereto.

The oxide layer 51 may be disposed on the laser cavity 30. The oxide layer 51 may be doped with the same type of dopant as the upper reflective layer 40. For example, the oxide layer 51 may be doped with a p-type dopant at a concentration of about $10^{18}$ cm$^{-3}$, but the present disclosure is not necessarily limited thereto.

The oxide layer 51 may include a semiconductor compound containing aluminum, such as AlAs, AlGaAs, InAl-GaAs, or the like. The oxide layer 51 according to the embodiment may include the first hole h1 formed at a center thereof. That is, the oxide layer 51 may have a donut shape in which a hole is formed at a center thereof. The oxide layer 51 may have a relatively high resistance and a relatively low refractive index. Therefore, since current may be injected into the first hole h1, laser light may be collected toward a center of the device. That is, the first hole h1 may allow the current and the light to pass therethrough.

Referring to FIG. 14, in a laser structure, a sidewall of an oxide layer 51 may be exposed and oxidized. The oxidation may be gradually performed from the sidewall of the oxide layer 1 to a center thereof. An oxidized outer portion 1a may be increased in resistance and an unoxidized central portion 1b may function as an oxide aperture through which current or light passes.

However, a degree of oxidation of the oxide layer 51 may be affected by various conditions, such as a composition of a semiconductor compound contained in the oxide layer 51, an orientation of the compound, a thickness of the layer, an oxidation process, and the like. That is, it is very difficult to precisely control the oxide aperture.

Referring again to FIGS. 12 and 13, in the embodiment, even when the oxidation conditions are changed, when an entirety of the oxide layer 51 in which the first hole h1 is formed is oxidized, the region which will be oxidized no longer exists. This is because the upper reflective layer 40 disposed in the first hole h1 is not oxidized well even when the upper reflective layer 40 is exposed to oxygen. That is, the upper reflective layer 40 disposed in the first hole h1 may serve as a stopper of oxidation reaction so as to automatically terminate the oxidation.

Therefore, there is an advantage in that an oxide aperture corresponding to a diameter of the first hole h1 may be obtained even when a degree of oxidation is not precisely controlled. Therefore, a manufacturing process may be simplified and a yield may be improved. Further, even when several tens of wafers are oxidized by one oxidation process, a uniform oxide aperture may be manufactured and a production speed may be increased.

Therefore, the conditions required for an oxidation reaction to occur well in the oxide layer 51 according to the embodiment may be changed. For example, the oxidation reaction may occur well as a thickness of the oxide layer 51 increases, an aluminum composition increases, and a doping concentration increases.

The thickness of the oxide layer 51 may range from 50 Å to 5,000 Å. When the thickness of the oxide layer 51 is smaller than 50 Å, there is a problem in that an oxidation rate is very low and a process time becomes too long, and when the thickness is greater than 5,000 Å, there is a problem in that cracks are generated at the end of the oxide aperture due to thickness shrinkage after oxidation.

The doping concentration of the oxide layer 51 may range from $1 \times 10^{15}$ cm$^{-3}$ to $1 \times 10^{20}$ cm$^{-3}$. When the doping concentration of the oxide layer 51 is smaller than $1 \times 10^{15}$ cm$^{-3}$, there is a problem in that the oxidation rate is lowered and the process becomes longer, and when the doping concentration is greater than $1 \times 10^{20}$ cm$^{-3}$, there is a high risk that electrical and/or optical losses increase due to an increase in internal defects.

The aluminum composition of the oxide layer 51 may range from 80% to 100%. When the aluminum composition of the oxide layer 51 is 80% or less, there is a problem in that the oxidation rate is lowered and the process becomes longer.

A capping layer 52 may be disposed on the oxide layer 51. The capping layer 52 may serve to protect the oxide layer 51 form being exposed to an external environment during or after the process. As described above, the oxide layer 51 may be designed to have a high aluminum composition and a high doping concentration so as to be easily oxidized. Therefore, when there is no capping layer 52, the oxide layer 51 may have already been oxidized before the oxidation process is performed thereon. The growth of the upper reflective layer may be difficult because it is difficult to grow the semiconductor layer on the oxide layer 51 which is already oxidized. Therefore, the capping layer 52 may prevent the oxide layer 51 from being pre-oxidized prior to the oxidation process.

The oxide layer 51 according to the embodiment, on which the upper reflective layer 40 is regrown, may include a semiconductor compound containing aluminum, such as AlAs, AlGaAs, InAlGaAs, or the like. That is, the oxide layer 51 according to the embodiment may include arsenic (As) so that a semiconductor layer may be grown thereon.

The capping layer 52 may include at least one selected from GaAs, AlGaAs, InAlGaAs, AlGaAsSb, AlGaAsP, GaInP, InGaAsP, and AlInGaP, but the present disclosure is not necessarily limited thereto.

Further, the capping layer 52 may be made of one or more layers including one or more materials selected from GaAs, AlGaAs, InAlGaAs, AlGaAsSb, AlGaAsP, GaInP, InGaAsP, and AlInGaP.

When the capping layer 52 includes aluminum, an aluminum composition of the capping layer 52 may be smaller than the aluminum composition of the oxide layer 51. For example, the aluminum composition of the capping layer 52 may range from 0% to 60%. When the aluminum composition of the capping layer 52 is greater than 60%, a surface of the capping layer 52 may be exposed to air and oxidized during the process, and the capping layer 52 may also be oxidized while the oxide layer 51 is oxidized even after the upper reflective layer 40 is formed.

A thickness of the capping layer 52 may range from 2.5 Å to 5,000 Å. When the thickness of the capping layer 52 is 2.5 Å or less, there is a problem in that the capping layer 52 is too thin to effectively block the penetration of oxygen, and when the thickness is 5,000 Å or more, there is a problem in that a step is too large while the upper reflective layer 40 is regrown so that it is difficult to form a uniform interface.

A first intermediate layer 81 and a second intermediate layer 82 may be disposed between the laser cavity 30 and the oxide layer 51. The first intermediate layer 81 may have the same composition as the base layer 41 or the first upper reflective layer 42a. Further, the second intermediate layer 82 may have the same composition as the second upper reflective layers 42b. For example, the base layer 41 may include GaAs or AlGaAs, the first intermediate layer 81 may include GaAs, and the second intermediate layer 82 may include AlGaAs.

The first intermediate layer 81 may protect the laser cavity 30 during the oxidation process of the oxide layer 51. Therefore, an aluminum composition of the first intermediate layer 81 may be smaller than that of the second intermediate layer 82. For example, a thickness of the first intermediate layer 81 may range from 1 nm to 30 nm, but the present disclosure is not necessarily limited thereto.

Generally, when the oxide layer 51 is oxidized, a material may be amorphized, and film quality may be slightly lowered. Accordingly, when an amorphized layer in which film quality is slightly lowered is brought into direct contact with the laser cavity in which light is generated, the reliability of the device may be degraded. Therefore, the second intermediate layer 82 may be formed prior to the oxide layer to prevent the amorphized layer from being brought into direct contact with the laser cavity.

The upper reflective layer 40 may be disposed above the oxide layer 51 and the first hole h1. The upper reflective layer 40 may include a base layer 41 disposed on the oxide layer 51 and the first hole h1 and a plurality of first upper reflective layers 42a and second upper reflective layers 42b disposed on the base layer 41.

The first upper reflective layer 42a may have a composition of AlGaAs, and the second upper reflective layers 42b may have a composition of GaAs. Therefore, an aluminum composition of the first upper reflective layer 42a may be higher than that of the second upper reflective layers 42b.

The upper reflective layer 40 may be doped to have a polarity different from that of the lower reflective layer 20. For example, when the lower reflective layer 20 and the substrate 10 are doped with an n-type dopant, the upper reflective layer 40 may be doped with a p-type dopant.

The upper reflective layer 40 may have fewer layers than the lower reflective layer 20 to lower reflectance from the VCSEL so that an emission direction of the laser light is opposite to that of the substrate 10. That is, the reflectance of the upper reflective layer 40 may be smaller than that of the lower reflective layer 20.

The reflectance of the upper reflective layer 40 may be designed based on the thickness from the second intermediate layer 82 to an uppermost surface of the upper reflective layer 40. In this case, a first region S1 may be defined as an opening region (an in-phase region) in which light is propagated and amplified, and an outer region S2 of the first region S1 may be defined as a region (an anti-phase, region) in which no light is propagated. A diameter of the first region S1 may be a diameter of a region in which the upper reflective layer 40 is exposed through the second hole h2 of the ohmic layer 61.

In some embodiments, a diameter of the first hole h1 may be greater than a diameter of the first region S1. Since most laser light is propagated in the first region S1, an end of the first hole h1 does not affect the light propagation and amplification regions. Therefore, optical scattering and light absorption may be minimized at the end of the first hole h1. Therefore, light efficiency may be increased and the lifetime of the device may also be improved as compared with the conventional structure.

When the first hole h1 is disposed in an inside of the first region S1 or the diameter of the first hole h1 is equal to the diameter of the first region S1, there is a problem in that the light may be scattered or absorbed at the end of the first hole h1.

The diameter of the first region S1 may range from 6% to 98% of the diameter of the first hole h1 on the basis of 100% of the diameter of the first hole h1. Typically, a diameter of an oxide aperture ranges from about 3 to 15 μm. In this case, when the diameter is smaller than 6%, the light output is significantly lowered due to the diameter of the first region Si becoming 1 μm or less, and when the diameter is greater than 98%, there is a problem in that the light may be scattered or absorbed at the end of the first hole h1.

The base layer 41 of the upper reflective layer 40 may have a planarized upper surface 41a. That is, the base layer 41 may cover the first hole h1 so that the upper surface thereof may be planarized. According to the above configuration, since the plurality of first upper reflective layers 42a and second upper reflective layers 42b are disposed on the flat base layer 41, reliability may be improved.

The base layer 41 may include a region disposed on the oxide layer 51 and a region disposed in the first hole h1. A thickness d2 of the region disposed in the first hole h1 may be greater than a thickness d3 of the region disposed on the oxide layer 51.

A ratio d3/h1 of a maximum thickness d3 of the base layer 41 to a maximum diameter of the first hole h1 may range from 0.001 to 0.3. When the ratio is out of the above range, the thickness of the base layer 41 may deviate from an appropriate range and the performance of the device may be degraded.

A sum of the thicknesses of the base layer 41 and the first intermediate layer 81 which are disposed in the first hole may satisfy 1, 3, 5, 7, 9, or 11 quarter-wave optical thickness (QWOT). For example, when a target wavelength is 980 nm, a thickness of 1 QWOT may be about 69.47 nm. However, the present disclosure is not limited thereto, and an effective optical thickness which is at least one of ¼ ¾, 5/4, 7/4, 9/4, and 11/4 of the optical wavelength may be obtained. That is, the base layer 41 and the first intermediate layer 81 may serve as one second upper reflective layer 42b. Therefore, the base layer 41 and the first intermediate layer 81 may have the same composition. For example, the base layer 41 and the first intermediate layer 81 may include GaAs. As a result, the base layer 41 may not be oxidized even when the oxide layer 51 is oxidized.

The first electrode 71 may be disposed on the upper reflective layer 40 and the second electrode 11 may be disposed below the substrate 10. However, the present disclosure is not limited thereto, and an upper portion of the substrate 10 may be exposed and then the second electrode 11 may be disposed in the exposed region.

The first electrode 71 and the second electrode 11 may include at least one of ITO, IZO, IZTO, IAZO, IGZO, IGTO, AZO, ATO, GZO, IZON, AGZO, IGZO, ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present disclosure is not limited to the above materials.

For example, the first electrode 71 may have a plurality of metal layers (e.g., Ti/Pt/Au). In this case, a thickness of Ti may range from 100 to 400 Å and a thickness of Au may range from 3,000 to 20,000 Å, but the present disclosure is not necessarily limited thereto.

The second electrode 11 may have a plurality of metal layers (e.g., AuGe/Ni/Au). In this case, a thickness of AuGe may be 1,000 Å, a thickness of Ni may be 100 Å, and a thickness of Au may be 2,000 Å, but the present disclosure is not necessarily limited thereto.

An ohmic layer 61 may be further disposed between the first electrode 71 and the upper reflective layer 40. The ohmic layer 61 may include a material having a band gap lower than or equal to a band gap of a GaAs substrate 10 and lower than or equal to energy of the emitted laser light for low ohmic resistance. For example, the ohmic layer 61 may include any one selected from AlInGaAs, InGaAs, GaAs, AlInGaAsSb, AlInGaAsPSb, InGaAsP, InGaAsPSb, GaAsSb, InGaAsSb, InAsSb, AlGaAsSb, AlGaAsP, and AlGaInAsP. A diameter of the second hole h2 of the ohmic layer 61 may be smaller than the diameter of the first hole h1. That is, since the ohmic layer 61 is disposed in a region in which no light is propagated, the ohmic layer 61 may not affect the light output.

FIG. 15 is a view showing a process of filling the first hole with an epitaxial layer which is grown on the first hole, FIG. 16 is a graph showing a growth rate of the epitaxial layer which is grown on the first hole according to a time (a time before and after $t_4$) of FIG. 15, FIG. 18 shows a second modification of FIG. 13, and FIG. 19 shows a third modification of FIG. 13.

Referring to FIGS. 15 and 16, the base layer 41 according to the embodiment may include a stepped portion SL1 disposed on the first hole while being grown on the first hole h1. In this case, in the base layer 41, a thickness of a region $T_1$ disposed on the first hole h1 may be greater than a thickness of a region $T_2$ disposed above the oxide layer 51. A difference between the thicknesses may be caused by the difference between a growth rate of the epitaxial layer in a region inside the first hole and a growth rate of the epitaxial layer in a region outside the first hole, as shown in FIG. 16. That is, it can be seen that, during times $t_1$ to $t_4$, the growth rate of the epitaxial layer in the region inside the first hole h1 is higher than the growth rate of the epitaxial layer in the region outside the first hole, while the growth rate of the epitaxial layer in the first hole h1 and the growth rate of the epitaxial layer on an upper region of the oxide layer 51 become equal to each other after the completion of the planarization of the first hole.

Therefore, portions of the first upper reflective layer 42a and the second upper reflective layers 42b which are disposed on the base layer 41 may have stepped portions SL2 and SL3. However, the stepped portions may gradually become smaller as the layers are stacked, and the planarization having a planarized surface may be completed after a certain time point.

As shown in FIG. 17, an inner wall of the capping layer 52 may have a protrusion 52a having a longer length in a direction of a center of a side surface of the oxide layer 51. An exposed area of the inner wall of the oxide layer may be reduced due to the protrusion 52a. A length of the protrusion 52a may be more than zero and less than 3 μm, but the present disclosure is not limited thereto. The protrusion 52a may be formed due to a difference in etch rate of the epitaxial layer. The inner wall of the oxide layer 51 may be unintentionally inclined (in particular, by wet chemical etching using a solution) during the etching process.

Referring to FIG. 18, the capping layer 52 may include an extended portion 52b extending along the inner wall of the first hole h1 of the oxide layer 51. In this case, the extended portion may suppress the occurrence of interface defects between the upper reflective layer 40 and the oxide layer 51 disposed inside the first hole h1.

A minimum thickness of the extended portion 52b may range from 2.5 Å to 2,000 Å. When the thickness of the extended portion 52b is 2.5 Å or less, there is a problem in that the occurrence of interface defects may not be suppressed between the upper reflective layer 40 and the oxide layer 51, and when the thickness is 2,000 Å or more, a problem may occur in the uniformity of the reflective films which are grown near the side surface of the oxide layer 51 when the upper reflective layer 40 is grown.

The extended portion 52b may be formed by forming a material at an edge into the relatively low first hole h1 when the material is thermally treated at a high temperature in a $PH_3$ atmosphere (an InGaP or InGaAsP-based material) or an $AsH_3$ atmosphere (a GaAs-based material) after the capping layer 52 is formed on the oxide layer 51.

Referring to FIG. 19, a light-transmitting layer 54 may be further disposed in the first hole h1 of the oxide layer 51. The light-transmitting layer 54 may be made of a material having conductivity to facilitate current injection and having a high transmittance so that light emitted from the laser cavity 30 in which the active layer is positioned at the center thereof may be emitted well. For example, the light-transmitting layer 54 may include a semiconductor compound such as InAlGaAs, InAlGaP, InGaAsP, or ZnSeS, but the present disclosure is not necessarily limited thereto.

FIG. 20 is a graph showing measured reflectance of the laser device according to the embodiment of the present disclosure, and FIG. 21 is a graph showing measured refractive index and electric field intensity of the laser device according to the embodiment of the present disclosure.

As shown in FIG. 20, it can be confirmed that, in the first region, reflectance of the upper reflective layer 40 is about 99.5% at a wavelength band of 940 nm to 1,040 nm, except for a wavelength band of about 980 nm, while the reflectance at 980 nm is the lowest. Therefore, it can be seen that the laser device may output laser light of about 980 nm.

FIGS. 22A to 22K are views showing a method for manufacturing a laser device according to an embodiment of the present disclosure.

Referring to FIG. 22A, a substrate 10, a lower reflective layer 20, a laser cavity 30, a second intermediate layer 82, a first intermediate layer 81, an upper reflective layer 40, an oxide layer 51, and a capping layer 52 may be sequentially formed. Characteristics of each of the layers may be applied as they are to the above-mentioned configurations.

Referring to FIG. 22B, a first hole h1 may be formed at a center of the capping layer 52 and the oxide layer 51 by disposing a first mask on the capping layer 52 and then etching. The first mask 81 may include SiO, $Si_xO_y$, $Si_3N_4$, $Si_xN_y$, $SiO_xN_y$, $Al_2O_3$, $TiO_2$, AlN, or a photoresist, but the present disclosure is not necessarily limited thereto.

Referring to FIGS. 22C and 22D, the upper reflective layer 40 may be regrown on the oxide layer 51 and the first hole h1. Therefore, the oxide layer 51 may be disposed between the lower reflective layer 20 and the upper reflective layer 40.

The upper reflective layer 40 disposed on the oxide layer 51 may include a base layer 41 covering the first hole h1. A sum of thicknesses of the base layer 41 and the first intermediate layer 81 may satisfy 1, 3, 5, 7, 9, or 11 QWOT. A plurality of first upper reflective layers 42a and second upper reflective layers 42b may be disposed on the base layer 41.

Thereafter, a second hole h2 may be formed by forming an entirety of an ohmic layer 61 on the upper reflective layer 40 and then removing a region corresponding to a first groove 44. In some embodiments, most laser light may be emitted through the second hole h2 without being incident on the ohmic layer 61. Therefore, the ohmic layer 61 may use a material having a band gap lower than or equal to that of a GaAs substrate 10 and lower than or equal to the energy of the emitted laser light.

Referring to FIGS. 22E to 22H, a first electrode 71 may be formed on the ohmic layer 61, a second mask 82 may be formed on the first electrode 71, and then an edge region in which the second mask 82 is removed may be etched.

Referring to FIG. 22I, a side surface of the oxide layer 51 may be oxidized. In some embodiments, an aperture may be formed in which current is already injected by the first hole h1 and through which light may be emitted, and thus it is not necessary to precisely control a degree of oxidation of the oxide layer 51. That is, when the entirety of the oxide layer 51 is oxidized, the oxidation process may be automatically terminated.

For example, the oxidation process may be performed by exposing a sample to a reaction tube provided with a $N_2$ and $H_2O$ mixed gas atmosphere within a temperature range of about 300° C. to 450° C. for about 30 to 50 minutes, but the present disclosure is not necessarily limited thereto. Further, the thickness, doping concentration, and aluminum composition of the oxide layer 51 according to the embodiment may be adjusted so that the oxidation of the oxide layer 51 is rapidly performed.

Referring to FIG. 22J, a protective layer 90 may be disposed in the etched edge region. The protective layer 90 may be made of various materials capable of protecting an outer side of the laser device. For example, the protective layer 90 may include at least one of $SiO_2$, $Si_3N_4$, SiON, $Ta_2O_5$, HfO2, BCB, and a polyimide, but the present disclosure is not necessarily limited thereto. Further, a process of curing the protective layer 90 may be further performed as necessary.

Referring to FIG. 22K, a pad electrode 72 connected to the first electrode 71 may be formed. Further, a second electrode 11 may be formed below the substrate 10.

FIGS. 23A to 23C are views showing a modification of the method for manufacturing the laser device according to the embodiment of the present disclosure.

Referring to FIGS. 23A and 23B, a substrate 10, a lower reflective layer 20, a laser cavity 30 including an active layer positioned at a center thereof, an upper reflective layer 40, an oxide layer 51, and a capping layer 52 may be sequentially formed. A first mask 81 may be disposed on the capping layer 52 and then etched to form a first hole h1 at a center of the capping layer 52 and the oxide layer 51.

Thereafter, the capping layer 52 may be formed above the oxide layer 51 and thermally treated to form an extended portion 52b of the capping layer 52 on an inner wall of the first hole h1. Specifically, when the capping layer 52 is formed above the oxide layer 51 and subjected to thermal treatment in a $PH_3$ atmosphere (an InGaP or InGaAsP-based material) or an $AsH_3$ atmosphere (a GaAs-based material) at a high temperature, a capping material present at the edge may move into the relatively low first hole h1 to form the extended portion 52b. In this case, the thermal treatment temperature may range from 500° C. to 900° C. According to the above configuration, the extended portion 52b may serve as a stopper so as to prevent the progress of oxidation.

Referring to FIG. 23C, the upper reflective layer 40 may be formed on the oxide layer 51 and the first hole h1. The subsequent processes may be performed in the same manner as those in FIGS. 22E to 22K.

Referring to FIG. 24, a laser array may include a plurality of light emitting cells E1 arranged in a matrix form. The number of the light-emitting cells E1 is not particularly limited. For example, the number of the light-emitting cells may be 100 or more.

The plurality of light-emitting cells E1 may share a lower reflective layer and a laser cavity with each other, and an oxide layer 51 and an upper reflective layer may be formed separately from each other. Therefore, each of the light-emitting cells E1 may have a ring-shaped oxide layer 51.

Each of the light-emitting cells E1 may include all the structures of the above-described lasers. As described above, since a termination time point of oxidation is automatically determined by the capping layer 52 or the like, a laser device may have the same diameter h1 of a light-transmitting region even when the oxidation process is simultaneously performed on the plurality of light-emitting cells E1.

The laser device according to the present embodiment may be used as a light source for three-dimensional (3D) face recognition and 3D imaging techniques. In 3D face recognition and 3D imaging techniques, a structured light source matrix in the form of a two-dimensional array is required. Such a structured light source matrix in the form of a two-dimensional array may be applied to an object to analyze a pattern of the reflected light. In this case, deformed states of element light reflected from a curved surface of each shape object of the structured light source matrix in the form of the two-dimensional array are analyzed, and thus a 3D image of the object may be formed. When the structured light source in the form of the two-dimensional array is manufactured with the VCSEL array according to the embodiment, it is possible to provide a structured light source matrix in the form of the two-dimensional array in which the characteristics of each element light source are uniform.

Further, the laser devices according to the present disclosure may be used as low-cost VCSEL light sources for many applications such as optical communication devices, CCTV, automotive night vision, motion recognition, medical/therapeutic, communication devices for Internet of Things (IoT), heat tracing cameras, thermal imaging cameras, pumping of solid state laser (SOL), a heating process for bonding plastic films, and the like.

While the present disclosure has been particularly described with reference to embodiments, the embodiments are only exemplary embodiments of the present disclosure. It will be understood by those skilled in the art that modifications and applications in other forms may be made without departing from the spirit and scope of the present disclosure. For example, each component specifically shown in the embodiments may be modified and embodied. In addition, it should be understood that differences related to these modifications and applications are within the scope of the present disclosure as defined in the appended claims.

The invention claimed is:

1. A vertical cavity surface emitting laser comprising:
a substrate;
a lower reflective layer disposed on the substrate;
an active layer disposed on the lower reflective layer;
an oxide layer disposed on the active layer and including a first hole formed at the center thereof;
a capping layer disposed on the oxide layer; and
an upper reflective layer disposed on the capping layer and the first hole,
wherein an aluminum composition of the capping layer is smaller than an aluminum composition of the oxide layer.

2. The vertical cavity surface emitting laser of claim 1, wherein the upper reflective layer includes a stepped portion disposed on the first hole.

3. The vertical cavity surface emitting laser of claim 1, wherein the upper reflective layer includes a plurality of first upper reflective layers and a plurality of second upper reflective layers,
wherein the plurality of first upper reflective layers and the plurality of second upper reflective layers are alternately disposed, and
the first upper reflective layer has a refractive index higher than that of the second upper reflective layer.

4. The vertical cavity surface emitting laser of claim 2, wherein a width of the stepped portion of the upper reflective layer decreases as a distance from the active layer increases.

5. The vertical cavity surface emitting laser of claim 4, wherein the upper reflective layer includes a first groove formed in an outermost layer thereof,
wherein the first groove has a diameter smaller than that of the first hole.

6. The vertical cavity surface emitting laser of claim 1, wherein the capping layer includes an extended portion configured to extend along an inner wall of the first hole.

7. The vertical cavity surface emitting laser of claim 6, wherein a thickness of the extended portion is smaller than a thickness of the capping layer.

8. The vertical cavity surface emitting laser of claim 1, further comprising an electrode disposed below the substrate.

9. The vertical cavity surface emitting laser of claim 1, further comprising:
a first electrode disposed on the upper reflective layer; and
an ohmic layer disposed between the first electrode and the upper reflective layer,
wherein an energy band gap of the ohmic layer is lower than or equal to an energy band gap of the substrate, and
the energy band gap of the ohmic layer is lower than or equal to energy of light emitted from the active layer.

10. The vertical cavity surface emitting laser of claim 9, wherein:
the ohmic layer includes a second hole formed at the center thereof; and
a diameter of the first hole is greater than a diameter of the second hole.

11. The vertical cavity surface emitting laser of claim 10, wherein the diameter of the second hole is from 6% to 98% of the diameter of the first hole.

12. The vertical cavity surface emitting laser of claim 11, wherein the ohmic layer includes any one of AlInGaAs, InGaAs, GaAs, AlInGaAsSb, AlInGaAsPSb, InGaAsP, InGaAsPSb, GaAsSb, InGaAsSb, InAsSb, AlGaAsSb, AlGaAsP, and AlGaInAsP.

13. The vertical cavity surface emitting laser of claim 1, wherein the capping layer includes one or more layers including one or more materials of GaAs, AlGaAs, InAlGaAs, AlGaAsSb, AlGaAsP, GaInP, InGaAsP, and AlInGaP.

14. A method for manufacturing a vertical cavity surface emitting laser, the method comprising:
sequentially forming a lower reflective layer, an active layer, an oxide layer, and a capping layer on a substrate;
forming a first hole at centers of the oxide layer and the capping layer;
forming an upper reflective layer on the capping layer and the first hole; and
oxidizing the oxide layer from a side surface thereof,
wherein, in the forming of the upper reflective layer, the upper reflective layer is formed by repeatedly stacking a plurality of layers, and a first groove having a diameter smaller than that of the first hole is formed on an uppermost layer of the upper reflective layer.

15. The method of claim 14, wherein, after the oxidizing of the oxide layer, a second hole is formed by forming an entirety of an ohmic layer on the upper reflective layer and then removing a region corresponding to the first groove.

16. A vertical cavity surface emitting laser comprising:
a substrate;
a lower reflective layer disposed on the substrate;
an active layer disposed on the lower reflective layer;
an oxide layer disposed on the active layer and including a first hole formed at the center thereof;
a capping layer disposed on the oxide layer; and
an upper reflective layer disposed on the capping layer and the first hole,
wherein the upper reflective layer includes a stepped portion disposed on the first hole,
wherein a width of the stepped portion of the upper reflective layer decreases as a distance from the active layer increases.

17. A vertical cavity surface emitting laser comprising:
a substrate;
a lower reflective layer disposed on the substrate;
an active layer disposed on the lower reflective layer;
an oxide layer disposed on the active layer and including a first hole formed at the center thereof;
a capping layer disposed on the oxide layer; and
an upper reflective layer disposed on the capping layer and the first hole,
wherein the capping layer includes an extended portion configured to extend along an inner wall of the first hole.

18. A vertical cavity surface emitting laser comprising:
a substrate;
a lower reflective layer disposed on the substrate;
an active layer disposed on the lower reflective layer;
an oxide layer disposed on the active layer and including a first hole formed at the center thereof;
a capping layer disposed on the oxide layer; and
an upper reflective layer disposed on the capping layer and the first hole,
a first electrode disposed on the upper reflective layer; and
an ohmic layer disposed between the first electrode and the upper reflective layer,
wherein an energy band gap of the ohmic layer is lower than or equal to an energy band gap of the substrate, and
wherein the energy band gap of the ohmic layer is lower than or equal to energy of light emitted from the active layer.

* * * * *